(12) United States Patent
Quan

(10) Patent No.: US 7,550,977 B2
(45) Date of Patent: Jun. 23, 2009

(54) METHOD AND APPARATUS TO MEASURE DIFFERENTIAL PHASE AND FREQUENCY MODULATION DISTORTIONS FOR AUDIO EQUIPMENT

(76) Inventor: Ronald Quan, 10910 Wunderlich Dr., Cupertino, CA (US) 95014

( * ) Notice: Subject to any disclaimer, the term of this patent is extended or adjusted under 35 U.S.C. 154(b) by 198 days.

(21) Appl. No.: 11/508,700

(22) Filed: Aug. 23, 2006

(65) Prior Publication Data

US 2007/0069739 A1 Mar. 29, 2007

Related U.S. Application Data

(60) Provisional application No. 60/721,027, filed on Sep. 27, 2005.

(51) Int. Cl.
*G01R 23/20* (2006.01)
*H03C 3/00* (2006.01)
(52) U.S. Cl. ..................... 324/622; 332/118
(58) Field of Classification Search ............ 324/622; 332/118
See application file for complete search history.

(56) References Cited

U.S. PATENT DOCUMENTS

| 4,273,970 A * | 6/1981 | Favin et al. ............... 324/624 |
| 5,093,636 A * | 3/1992 | Higgins et al. ............ 332/119 |
| 5,420,516 A * | 5/1995 | Cabot ........................ 324/620 |
| 5,475,315 A * | 12/1995 | Cabot ........................ 324/620 |
| 5,818,240 A * | 10/1998 | Cabot ........................ 324/620 |
| 6,405,147 B1 * | 6/2002 | Fera ............................. 702/75 |

OTHER PUBLICATIONS

Cordell, Robert R., *A MOSFET Power Amplifier with Error Correction*, Regional Bell Operating Companies, Central Services Organization, Holmdel, NJ, presented at the 72nd Convention of the Audio Engineering Society, Anaheim, CA, Oct. 23-27, 1982, 16 pages.

Cordell, Robert R., *Phase Intermodulation Distortion—Instrumentation and Measurements Results*, Bell Laboratories, Holmdel, NJ, presented at the 70th Convention of the Audio Engineering Society, New York, NY, Oct. 30-Nov. 2, 1981, 40 pages.

Craig, Margaret, *Television Measurements—NTSC Systems*, Tektronix, May 1994, pp. 47-72.

Metzler, Bob, *Measurement of Non-Linearity*, Audio Precision Audio Measurement Handbook, Audio Precision, Inc., Aug. 1993, pp. 23-59.

Wow & Flutter Meter Instruction Manual, Leader Electronics Corp., Hauppauge, NY, 1990, 18 pages.

* cited by examiner

*Primary Examiner*—Timothy J Dole
(74) *Attorney, Agent, or Firm*—George B. Almeida

(57) ABSTRACT

A testing method or apparatus utilizes multiple frequencies applied to a device under test for measuring newly discovered frequency modulation effects. An embodiment may include a lower frequency signal with a smaller amplitude higher frequency signal to test a dynamic change in frequency response, gain, and or phase. This dynamic test can reveal frequency modulation effects. Another embodiment may include the use of a multiple frequency signal to dynamically induce a time varying phase or frequency distortion for the device that has differential phase distortion. The device's output is then measured with an FM detector to measure a shift in one of the frequencies used in the test signal or to measure frequency modulation effects of any signals, including distortion products, from the device. Yet another embodiment of the invention may include biasing a device with a voltage to span the output voltage range of the device while measuring harmonic or intermodulation distortion or phase or frequency response at the various operating points.

20 Claims, 17 Drawing Sheets

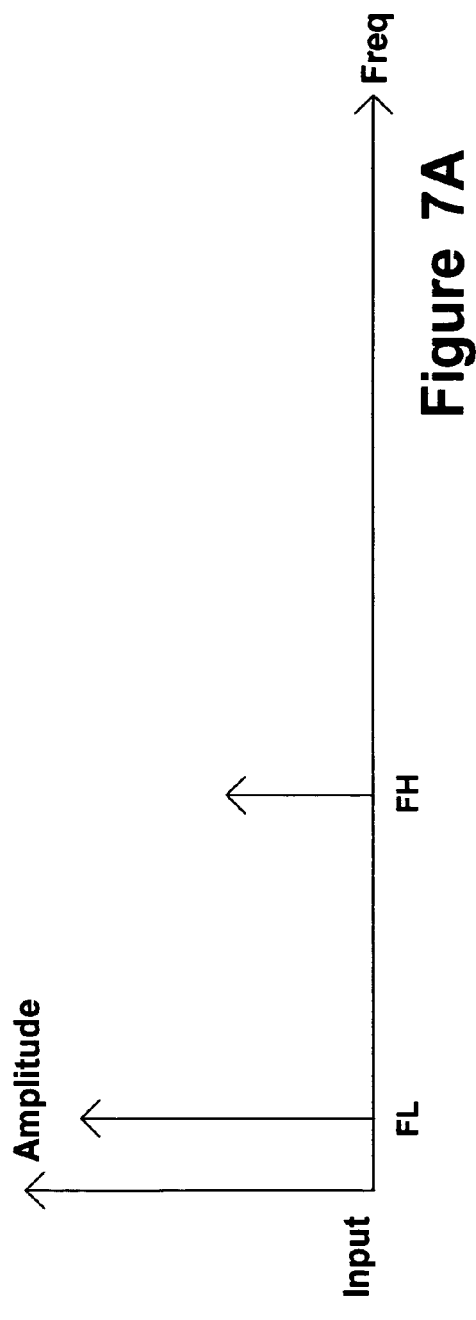
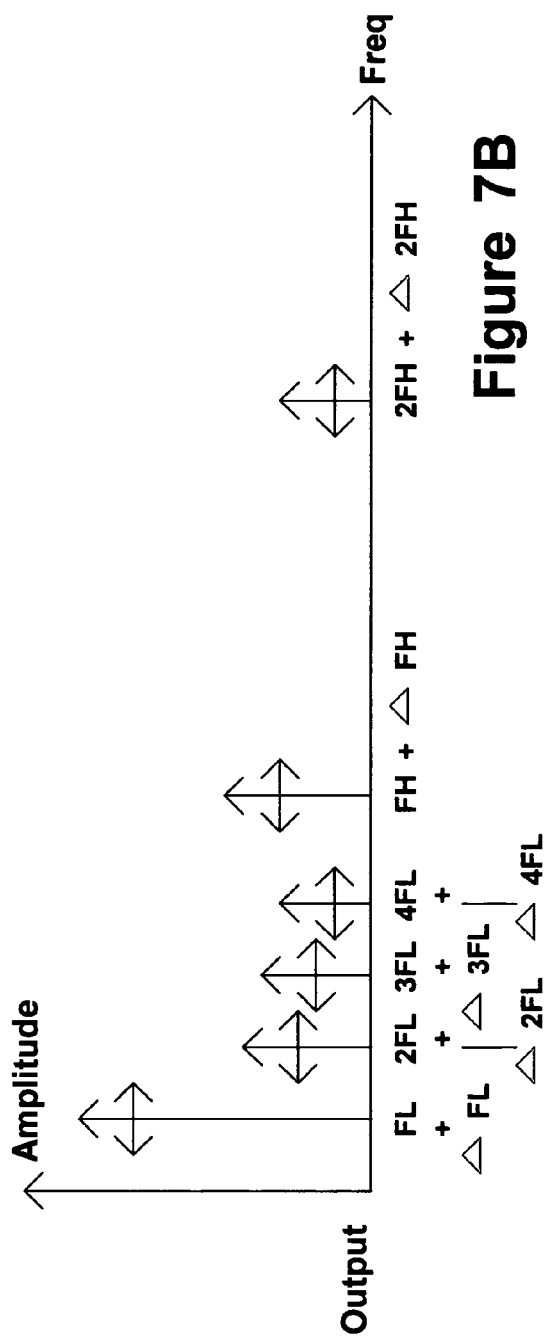

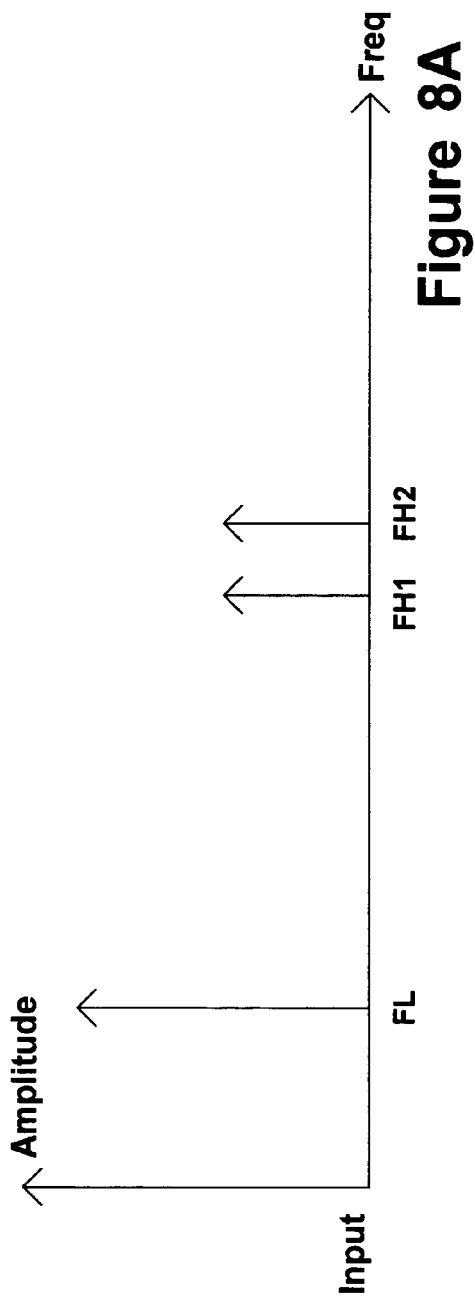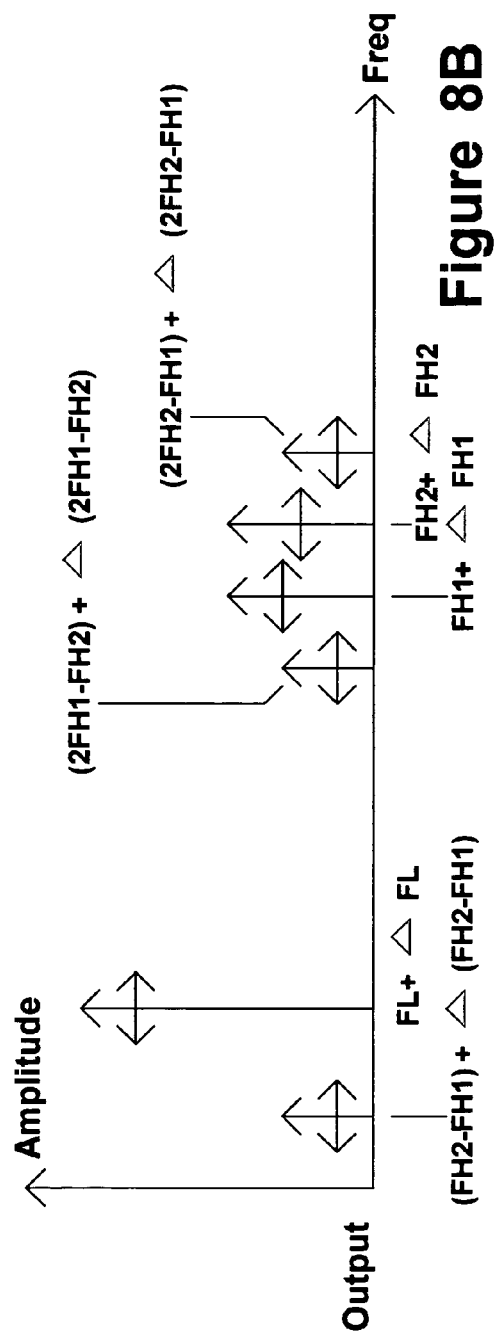

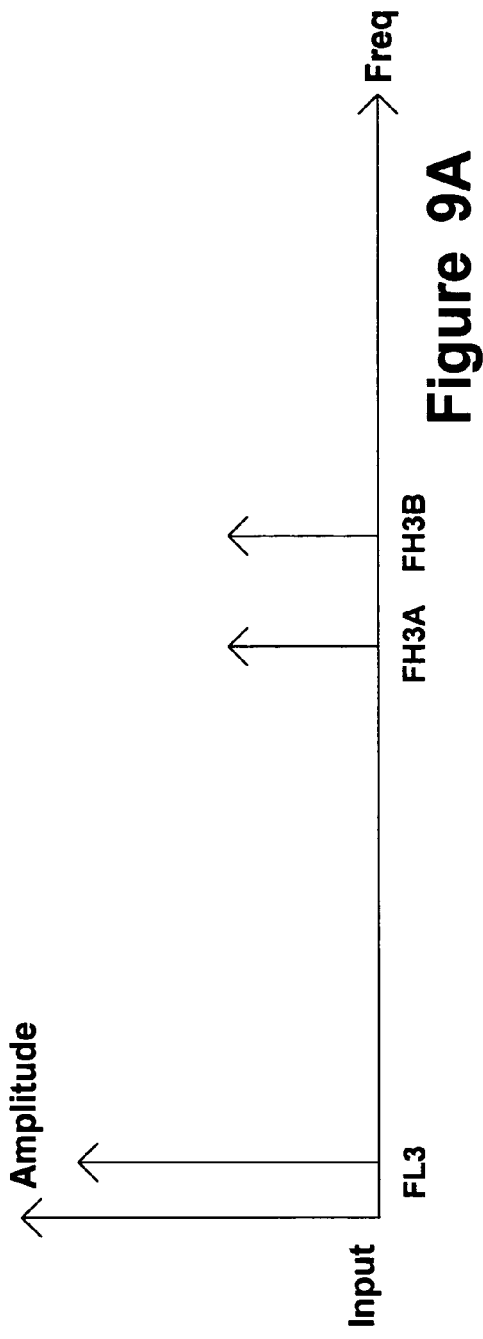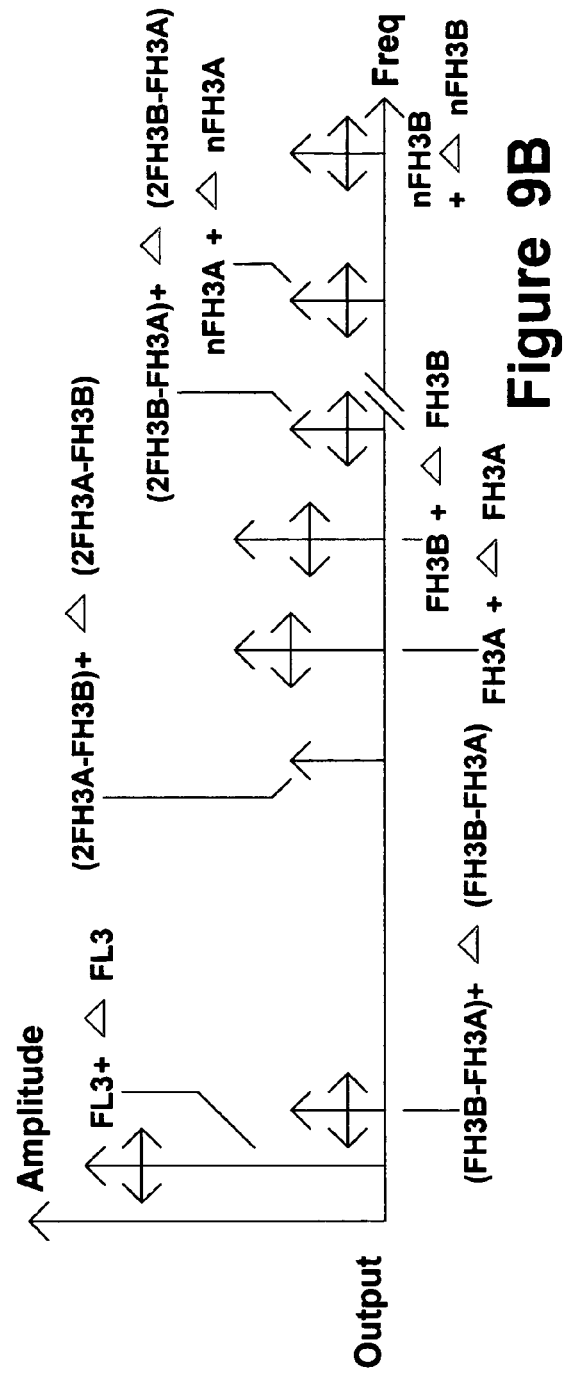

METHOD AND APPARATUS TO MEASURE DIFFERENTIAL PHASE AND FREQUENCY MODULATION DISTORTIONS FOR AUDIO EQUIPMENT

This application claims priority to U.S. provisional Ser. No. 60/721,027 filed Sep. 27, 2005, which is incorporated herein by reference.

BACKGROUND OF THE INVENTION

This invention is related to the testing of audio equipment and, in particular, analog to digital converters (ADC), digital to analog converters (DAC), digital audio processors or recorders, audio amplifiers, and the like.

DESCRIPTION OF THE PRIOR ART

Presently, conventional harmonic and or intermodulation distortion tests are used to measure the performance of the audio equipment.

An intermodulation distortion test provides for two tones to be applied to the device, in which the amplitude of the sum and or difference of the tones may appear at the output of the device. In one case an AM detector (or amplitude measurement) is used for evaluating second order amplitudes of the difference and or sum of the frequency intermodulation products (e.g., F1+F2 and or F1−F2).

In another intermodulation distortion measurement, two tones are coupled to the device and the amplitudes of the third order intermodulation distortion products (e.g., 2F1+F2, 2F1−F2, 2F2−F1, and or 2F2+F1) are measured.

While these conventional tests are fine for many basic evaluations of the equipment, there still exist discrepancies between the sonic signature of amplifiers and equipment even with comparable distortion performance from the prior art testing methods. Thus a new method of testing is required.

In audio testing, distortion is generally measured at a nominal (fixed) bias point for harmonic distortion. In the case of mechanical reproducing systems such as tape recorders and or phonograph players, conventional test methods are measuring harmonic and or intermodulation distortion. For measuring mechanical speed stability of the recorder or playback device, a single tone at about 3.00 KHz (or 3.15 KHz) is recorded and played back to assess Wow and Flutter (W & F).

It is well known in the past 40 years that video equipment uses a different set of performance tests. One of these tests is the differential phase measurement, which is based on a combined luma and chroma signal (e.g., modulated ramp or stairstep waveform and wherein the chroma signal is demodulated by a phase detector). This differential phase test allows an objective measurement of how a color signal of a particular color would change in hue under different brightness levels.

It is well known that program audio comprised of musical instruments and or voice may be a mixture of various low to middle frequency tones of a nominal (high) amplitude along with some smaller level of higher frequency components. Of course amplitude levels of low, middle, and higher frequencies occur in music.

It would be advantageous to provide different methods for addressing alternatives in testing audio equipment or other types of equipment.

SUMMARY OF THE INVENTION

The invention is concerned with measuring induced phase and or frequency modulation at the output (of any signal) from a device when two or more frequencies are coupled to the input of the device. This method of measuring induced phase and or frequency modulation may apply to various electronic equipment, amplifiers, processors, or the like over a wide range of frequencies.

A basic embodiment of the invention comprises measuring phase and or frequency modulation of a device under test (DUT) when two or more signals are coupled to the input of the DUT, wherein any phase or frequency modulation of any signal generated at the output of the DUT is measured. This basic embodiment may include measuring phase and or frequency modulation of any of the two or more input signals, harmonics of any input signals, and or any intermodulation components or products of the two or more input signals.

In an overview of some embodiments of the invention, these embodiments are distinguished over conventional chroma video differential phase tests and standard Wow and Flutter measurement tests.

A distinguishing aspect of the invention over the prior art video chroma signal subcarrier differential phase and or gain measurement systems is that the differential gain and phase measurements have been used for measuring the color saturation and or hue distortions for a (composite) color television (TV) signal (such as an NTSC video signal). These color saturation and or hue distortions arise from a color subcarrier signal superimposed on a video luminance signal. The luminance signal is of a lower frequency, which biases the color subcarrier signal (e.g., 3.58 MHz NTSC color subcarrier frequency) to different brightness levels. If the video system is not perfect, the result will be that as the picture brightness changes, the color, which is supposed to display constant color saturation and hue, will shift in saturation and or hue. So prior art measurements for chroma differential gain and phase pertains to what is displayed on a TV monitor in terms of distortions in color saturation and hue. The present invention does not pertain to color saturation or color hue distortions as displayed on a TV set.

A distinguishing aspect of the invention over prior art Wow and Flutter measurement methods is that prior art Wow and Flutter measurement systems are not used in amplifier or electronic systems. Instead, the Wow and Flutter measurements are to reveal speed irregularities in mechanical record and or playback systems such as tape recorders and phonograph turntables. Until the disclosure of this invention, non-mechanical systems such as amplifiers or audio processors have not been tested with a Wow and Flutter meter. Should a standard Wow and Flutter test is made on a non mechanical apparatus such as an amplifier, the Wow and Flutter will measure zero percent. That is, the standard single 3000 Hz tone from the Wow and Flutter test source into an amplifier will produce at the amplifier's output a 3000 Hz signal without Wow and Flutter and without frequency variations.

One basic discovery by the inventor involves the unexpected measurement of Wow and Flutter in amplifiers with a new testing method (e.g., a new test method that involves two or more frequencies instead of the one single frequency for standard Wow and Flutter measurement). Because electronic (non-mechanical) amplifiers are not known to behave like (mechanical) recorders or play back devices of recorded signals, it is then a unique process to measure Wow and Flutter via an amplifier circuit.

The new test method measures small variations of frequency or phase response differences as a function of output or input swing. These phase or frequency variations show up as Wow and Flutter when a dynamic biasing signal (which may include close to DC in frequency) is used, hence the need for more than one frequency for a new test in accordance with the invention.

In a mechanical recorder or playback machine, a speed variation exists upon recording or playback of an electronic signal. This mechanical player or recorder will exhibit an amount of speed variation, which translates to a frequency variation of an electronic signal. Such a frequency variation can lead to the characteristic for example of a "sour" tone for reproducing a sustained piano note.

The standard measurement technique is to supply a single frequency tone to the mechanical device for record and playback or for playback via a prerecorded media (e.g., prerecorded tape or disc). Upon playback of the mechanical device, the single frequency tone is measured for frequency variation via a Wow and Flutter meter (e.g., Leader model LFM-39A).

At least one embodiment of the invention is therefore distinguished over the standard measurement for Wow and Flutter. One reason is that at least another signal is added or involved, and or a modifier circuit or method is used to allow (e.g., reduce interference from the other signal or signals) for measuring the frequency variation of the signal involved.

Another reason that there is distinction is that Wow and Flutter meters are used for measuring speed variation of mechanical systems, not non mechanical apparatus such as electronic amplifiers or electronic processors.

Thus, one object of the invention is to measure frequency (or phase) variation of a signal caused by another signal.

In one embodiment, measurement is done such that a lower frequency signal causes a frequency (or phase) modulation on at least one higher frequency signal. Frequency or phase variation is then measured for any of the higher frequency signal(s), which may include its distortion components or products (e.g., from an amplifier or processor).

Alternatively, in another embodiment, measurement is done such that a higher frequency signal causes a frequency (or phase) modulation on one or more lower frequency signal. Frequency or phase variation is then measured for any of the lower frequency signal(s), which may include its distortion components or products (e.g., from an amplifier or processor).

For example, in one embodiment, a larger amplitude "low" frequency signal below 400 Hz is added to a 3 KHz signal from the Wow and Flutter meter (e.g., Leader model LFM-39A). The 3 KHz signal is adjusted to have a lower amplitude that that of the lower frequency signal (e.g., 100 Hz, 150 Hz, or 300 Hz, or any other frequency, or >300 Hz). The two signals are then combined and fed to the input of an amplifier or amplifier system, which may be named DUT (Device Under Test). The output of the amplifier or DUT is fed to a filter or modifier, which removes, modifies, and or attenuates the lower frequency signal. The output of the filter (or modifier) is then fed to a Wow and Flutter meter or a detector (e.g., phase detector and or FM detector).

For this example, the low frequency signal was 100 Hz (sine wave) and the higher frequency signal was 3000 Hz (sine wave). A simple (microphone) two-transistor feedback amplifier was set for a gain of 91 and had a −3 dB frequency response at 17 KHz. About 3.9 volts peak to peak of the example 10o Hz signal and about 100 millivolts to 160 millivolts peak to peak of the example 3000 Hz signal was measured at the output of the amplifier. Then a (e.g., 3000 Hz) bandpass, or high pass filter, or modifying circuit) filter/modifier essentially removed the 100 Hz signal and passed the 3000 Hz signal from the amplifier's output to the Wow and Flutter meter, which read 0.15% Wow and Flutter (W&F).

Considering the amplifier is not mechanical system, this new test showed an "unexpected" result that amplifiers exhibit Wow and Flutter during the presence of a multiple signal input.

In comparison to a very high quality cassette audio recorder such as the Pioneer CT-F1000 (cost of $600 from "High Fidelity Test Reports 1979" issue), the Wow and Flutter measured 0.08%. Note that in this cassette deck test, the Wow and Flutter meter only sends out either a 3000 Hz or a 3150 Hz test signal (but not both frequencies) for the cassette recorder to record and playback the test signal. (There is no other signal, other than the single tone involved for this standard W&F measurement of the cassette audio recorder).

Thus, the invention is considered novel over the prior art in that multiple signals or tones are used. These multiple signals or tones are sent to a DUT(device under test). The DUT is coupled to a modifier, which allows a Wow and Flutter meter or phase detector or FM detector to measure at least one particular test tone(s) essentially without interference from the other tones (e.g., lower frequency tones or any of its harmonics). Thus, from the example test with the two transistor amplifier mentioned above, this amplifier yielded almost twice the Wow and Flutter of a (mechanically driven) cassette tape recorder (e.g., 0.15% for amplifier under new testing method versus 0.08% for the Pioneer CT-F 1000 cassette audio recorder).

Other experiments with amplifiers that exhibit cross over distortion yielded similar results of the two-transistor amplifier experiment mentioned above. Cross over distortion in an amplifier causes a drop in bandwidth in the "dead zone", so as a dynamic biasing signal causes a higher frequency signal to go in and out of the dead zone, the frequency response changes in time.

And (in general) an increase in frequency for the dynamic biasing signal applied, the more change in phase occurs in time, which leads to a greater/increased FM effect or greater/increased frequency deviation (e.g., of a higher frequency signal). In some cases, an amplifier with cross over distortion yielded even more Wow and Flutter such as 0.175% (in this example of a new way to measure Wow and Flutter or to measure a frequency modulation effect of one signal induced by another signal). And if the lower frequency signal (e.g., dynamic biasing signal) is raised from 100 Hz to a higher frequency such as 140 Hz or higher, Wow and Flutter measurements (via an embodiment of the invention) increase to about 0.36% or higher.

Because there is a phase shift change in the (higher frequency) signal as a function of where the output is "biased" to, when the low frequency signal is increased in amplitude and or frequency, a greater change in phase shift over time of the higher frequency signal will occur. And the greater phase shift per time translates to a greater shift (e.g., deviation) in frequency of the higher frequency signal (e.g., more frequency modulation). For example, in another embodiment of the invention, a (higher amplitude) 2000 Hz signal was combined with a lower amplitude 15 KHz signal into the two transistor feedback amplifier example. The output of the two transistor feedback amplifier had comparable amplitude levels as the previous example with 100 Hz and 3000 Hz signals. And the output of this example amplifier was coupled to a high pass filter (to remove the 2 KHz signal while passing the 15 KHz signal), which was then coupled to a frequency to voltage converter. The output of the frequency to voltage converter revealed a frequency shift or deviation of 1.5% for the 15 KHz signal (caused by the 2000 Hz signal) from the output of the two transistor feedback amplifier example.

It should be noted that cascading amplifiers for making an amplifier system, (e.g., preamplifier coupled to a tone control amplifier, which then couples to a power amplifier) will generally cause an increase in phase or frequency modulation effect (e.g., in total). The phase and or frequency modulation effect of each amplifier in a chain may be additive or cumulative in some manner. Depending on the phase versus bias voltage effect on amplifiers, in some cases the cascading of certain amplifiers may reduce the phase and or frequency modulation.

In general but not limited to, the new test of the present invention comprises providing 2 or more frequencies such as a lower frequency signal to a higher frequency signal (to yield a complex or composite signal) and coupling this complex signal to the amplifier's or device's (e.g., a device may be electrical, mechanical, magnetic, optical, electromechanical, and or a transducer) input. At the output of the amplifier (or device) under test, the lower frequency signal (which may include any of its harmonics) is modified (e.g., reduced in amplitude or removed), and the higher frequency component is coupled to a detection circuit or system (e.g., computational system, Wow and Flutter meter, FM detector, phase detector, and or frequency to current or voltage converter). The lower frequency signal will cause a dynamic bias upon the amplifier or device under test, and thus the amplifier or device can exhibit a different frequency response (or phase change/delay) for each different bias point as defined by the test.

The difference in the higher frequency response (e.g., when biased by a lower frequency signal) yields a difference in phase response according to various bias points via the lower frequency signal. By measuring the phase changes or shifts or angles of the higher frequency signal as a function of bias points (caused by the lower frequency signal), the output phase modulation of the higher frequency signal can then be measured or computed. By providing a slope or derivative function of the phase modulation, a frequency modulation effect can be measured or computed.

Of course, the output of the modifying circuit, which contains the phase (or frequency) modulated signal may be coupled directly to a phase detector or frequency modulation detector. Examples of phase detectors may include mixers or multiplying circuits, balanced detectors, phase lock loop circuits and or the like. And examples of frequency modulation detectors may include frequency discriminators (e.g., Foster Seeley), ratio detectors, quadrature detectors, peak differential detectors, phase detectors, phase shifting circuits, phase lock loop circuits, pulse counting circuits, frequency to signal converters, slope detectors, and or the like.

In an another embodiment of the invention, a bias or operating voltage of an audio equipment is varied and a (e.g., nominally higher frequency) signal is added. Because many audio equipment such as digital systems or amplifiers may have different nonlinearities at various operating points such as quantizing error or crossover distortion, a fuller picture of the equipment is evaluated via a variable bias signal plus a (high frequency) signal.

For example, an embodiment of the invention may include biasing (e.g., providing a variable/dynamic offset voltage or current) an amplifier, device, and or a digital system with a voltage to span an output voltage range of the device while measuring harmonic or intermodulation distortion or phase or frequency (or phase) response at the various operating points.

In a further example, an embodiment provides one or more frequency signals above 10 KHz (such as a signal at 18 KHz and a signal at 20 KHz), and then provides a larger amplitude (lower frequency) signal in the range between 20 Hz and 10 KHz (such as a signal whose frequency is any between 20 HZ and 5 KHz; 300 Hz for example).

The lower frequency signal plus one or more of the higher frequency signals are then combined and coupled to the (DUT) (e.g., amplifier, ADC, and or DAC). The output of the DUT is then coupled to a modifier, which affects, modifies or removes the lower frequency signals (e.g., FL) and or the lower frequency signal's harmonics. The output of the modifier then is coupled to at least one detector such as a phase detector or an FM detector, which can measure the phase and or frequency modulation effect on the one or more higher frequency signals.

In the case of more than one higher frequency signal, the detector may include an apparatus or method to remove substantially all but one of the higher frequency signals, which may include intermodulation distortion signal(s). For example, to reduce interference from one (high frequency) signal to the other in terms of detection or demodulation (e.g., of phase modulation and or frequency modulation). Thus, in this example, the detector will measure phase and or frequency modulation effects on the 18 KHz and or 20 KHz signals caused by the 300 Hz signal. The detector (via a modifier) may be used to measure the phase and frequency modulation effects on one or more intermodulation distortion frequencies such as 2nd, 3rd, and or higher order intermodulation components (or harmonics).

For example, the detector may measure phase and or frequency modulation effects for second order intermodulation component. In this example, the sum and difference frequency distortion signals (e.g., 18 KHz+20 KHz=38 KHz, and or 20 KHz–18 KHz=2 KHz). And third order intermodulation distortion components (e.g., 2FH1–/+FH2, 2FH2–/+FH1) may be measured for phase and or frequency modulation effects. In this third order intermodulation example, 2×20 KHz–18 KHz=22 KHz, and 2×18 KHz–20 KHz=16 KHz and or the third order sum components. Also the phase and or frequency modulation effects of any of the harmonics of any of the higher frequency signals may also be measured. In this example, 2×20 KHz=40 KHz and or 2×18 KHz=36 KHz.

Of course other frequencies may be used for FH, such as making FH>FL (e.g., FL<2 KHz, FH>5 KHz).

For example, the lower frequency signal (FL) may be <2 KHz and the higher frequency components (FH) may be a signal or multiple signals at 9 KHz and or 10 KHz. In this example the second harmonics of the 9 KHz and or 10 KHz FH signals can be measured for phase and or frequency modulation effect(s).

Yet another embodiment may include a low frequency signal with a smaller amplitude higher frequency signal to test a dynamic change in frequency response, gain, and or phase. The change in phase with a time varying signal will then produce an FM effect.

Still another embodiment may include using a multiple frequency signal to dynamically induce a time varying phase (or frequency) distortion for the device that has differential phase distortion. The device's output is then measured with an FM (or PM) detector or discriminator in order to find a (frequency or dynamic phase) shift in at least one of the frequencies used in the test signal (or at least one of the distortion products from the DUT). For example, the complex or composite signal may include one or more lower frequency signals and more than one higher frequency signal. Another method of measuring dynamic phase (modulation) and or frequency (modulation) effects after the modifier, may reveal that the modulation effects may or may not track with the (various) higher frequency components. The modifier removes/attenuates the lower frequency signals and may remove or attenuate any harmonics of the lower frequency signals.

Another embodiment may include a high frequency reference signal added prior to or after a combination of a low frequency and higher frequency signal. The duration of the high frequency reference signal, which may include for example a synchronizing signal would be shorter than that of the low frequency and high frequency signal. This is similar to a TV signal, but is used to test for non-TV applications such as audio and or RF systems. In some cases, the audio device under test may output a signal not synchronous to the input signal (e.g., the output of a digital processor may not have exactly the same frequency at its output as its input signal's frequency). In this embodiment at least one synchronizing signal is needed at the output to provide a testing method or apparatus for generating a reference phase and or frequency, which is similar to a TV color burst signal or a data clock reference signal.

In an alternative embodiment of the invention for non-standard testing of audio (or other) equipment, one or more modulated waveforms may be coupled to the device. One such waveform may be an amplitude modulated waveform, which may be combined with an offset signal such as a ramp or generated waveform or DC offset that may be varied. Then the analysis of a modulated waveform's sidebands or carrier(s), in terms of any extra sidebands, or phase shifts in sidebands or carrier(s), or changes in frequency of any sidebands or carrier(s), is done (e.g., at the output of the device under test). A phase or frequency detector may also be used in analyzing the device under test in terms of phase or frequency errors.

Another modulated waveform (for another embodiment) may include a frequency or phase modulated signal that is added to an offset signal such as previously described. It also is possible to provide any combination of modulations on a signal for a non-standard test of audio equipment.

In any of the embodiments or examples described, the waveform may be set to a small amplitude as an offset is being varied for testing a digital system (e.g., analog to digital converter, or combined testing of analog to digital converter and or digital to analog converter) and or for testing an analog system. For example, quantizing errors can reveal shifts in frequency or phase, or sideband distortion.

Computational analysis of the sidebands generated by the higher frequency signal(s) may be found such that generating a Bessel function map that can then yield the deviation of the higher frequency's FM (or PM) effect. Some of the Bessel function sidebands may be out of phase, and a method to find/identify the phase can be done by adding an AM signal wherein the modulating signal includes fundamental and harmonics of a known phase. The AM signal is combined or added with the higher frequency signal (that may exhibit frequency modulation) and sidebands are assessed whether there was an increase or decrease in sideband amplitude. For example, those sidebands that are reduced in level denote an out of phase sideband. Once a sufficient number of or all sidebands are measured in amplitude and phase, the Bessel function can be determined. Thus the modulation index is calculated. With the modulation index calculated, the frequency or phase deviation of the higher frequency component is calculated or found.

Although the embodiments or examples described are generally for audio equipment testing, any of the test embodiments described herein may be used for testing of non-audio equipment, e.g., such as an RF amplifier/device or a part of a communication system or a video device.

A summary of various of the embodiments (in which any method may be an apparatus) of the invention is stated below:

A new testing method and apparatus comprises the application of multiple frequencies to a device under test for measuring newly discovered frequency modulation effects. This new testing method may be applied to audio and or radio frequency devices.

An embodiment may include a lower frequency signal with a smaller amplitude higher frequency signal to test a dynamic change in frequency response, gain, and or phase. This dynamic test can reveal frequency modulation effects.

Another embodiment may include using a multiple frequency signal to dynamically induce a time varying phase distortion for a device that has differential phase distortion. The device's output is then measured with an FM detector or discriminator in order to measure a shift in one of the frequencies used in the test signal or to measure frequency modulation effects of any signals (e.g., any test signals and or distortion products) output from the device.

For example, an embodiment of the invention may include biasing an amplifier or a digital system with a voltage to span the output voltage range of the device while measuring harmonic or intermodulation distortion or phase or frequency response at the various operating points.

Below is a further summary of various embodiments of the invention:

Method of measuring frequency modulation effects of an electronic device, wherein the device has an input and an output, comprising, coupling two or more frequency signals into the input, and providing an FM detector at the output of the device, to measure a frequency modulation effect or frequency shift for one or more frequency signals at the output of the device.

Method of measuring Wow and Flutter effects on an electronic device comprising, applying multiple frequencies to the input of the device, coupling the output of the device to the input of a modifier circuit, and coupling a Wow and Flutter meter to the output of the modifier.

The invention includes a method wherein the modifier circuit reduces amplitude of a frequency or removes one or more selected frequencies, and also a method of measuring induced phase or frequency modulation in a signal of multiple frequencies, or more than one signals of different frequencies.

The invention further includes a method of applying a signal or signals to the input of a device, and measuring via a phase and or frequency modulation detector at the output of the device at least one phase and or frequency modulation effect on any selected signal frequency from the output of the device.

The invention also includes:

A method wherein the selected frequency from the output of the device may include any fundamental, harmonic, and or intermodulation frequency component.

A method wherein an amplitude detector measures amplitude variations of any of the phase and or frequency modulated signal frequencies.

A method wherein the derivative of the phase detector is taken to provide a frequency modulation measurement, and or wherein an integrated function of the frequency modulation detector provides a phase modulation measurement.

A method wherein one of the signals is a dynamic biasing signal, wherein the dynamic biasing signal provides a dynamic offset output voltage or current, and A method of measuring dynamic distortion of an electronic device, wherein a dynamic offset voltage is combined with a test signal comprising, applying the combined dynamic offset voltage and test signal to the input of the device, and measuring the dynamic distortion for at least one offset voltage.

The invention also includes a method of providing an audio and or radio frequency test signal, comprising, adding and or inserting a lower frequency signal, one or more reference higher frequency signal packets of one or more frequencies, and one or more signals of higher frequencies to provide the test signal, and also a method wherein a unipolar or bipolar synchronizing signal is added or inserted.

The invention includes a method of measuring frequency modulation effects of a device under test, wherein a test signal is input to the device, and wherein the test signal includes a lower frequency signal combined with a higher frequency signal, comprising, coupling a frequency to voltage converter or FM detector to the output of the device, and measuring the higher frequency signal for at least one frequency modulation effect.

In addition the invention includes a method wherein the test signal includes a synchronizing signal, and a method wherein the measured frequency modulation effect is displayed.

Also included is a method of measuring a phase and or frequency modulation effect of a device, wherein the input of the device is coupled to at least one signal of two or more frequencies, wherein the at least one signal induces a phase or frequency modulation effect on the device, whereby the output of the device is coupled to a tunable filter which tunes to a selected frequency of a signal from the output of the device, and wherein a phase detector and or a frequency modulation detector measures the phase and or frequency modulation effect of the device.

The invention includes a method of a measuring a phase and or a frequency modulation effect of a device, comprising coupling multiple frequencies to the input of the device, wherein the output of the device generates a frequency modulation effect on one or more of its output signal frequencies, whereby the output of the device is coupled to a phase detector, FM detector, and or frequency to voltage converter for measuring at least one phase modulation and or frequency modulation effect of any signal frequency from the output of the device.

Further the invention includes a method wherein a modifier is couple to the output of the device, and whereby the modifier removes or reduces the amplitude of at least one selected signal frequency, wherein the output of the modifier is coupled to a Wow and Flutter meter.

The invention includes a method of measuring at least one phase modulation and or frequency modulation effect of an audio device that has an input and an output, comprising, coupling one or more signals including two or more frequencies to the input of the audio device, coupling a phase detector, FM detector, and or frequency to voltage converter to the output of the audio device to measure phase modulation and or frequency modulation at any signal frequency from the output of the device.

The invention further includes:

A method wherein a modifier or filter is placed between the output of the audio device and the input of the phase detector, FM detector, and or frequency to voltage converter.

A method wherein the modifier removes or reduces in amplitude one or more signals from the output of the audio device.

A method wherein the modifier is coupled to a Wow and Flutter meter, and

A method wherein the Wow and Flutter meter is modified for wider bandwidth.

BRIEF DESCRIPTION OF THE DRAWINGS

FIG. 5 shows another example embodiment of the invention.

FIG. 6 shows yet another example embodiment of the invention. For example an FM, PM, and or AM receiver will tune into various signal components from the DUT's output, which may be used to measure, capture, and or store frequency, phase, and or amplitude modulated deviations.

FIG. 7A shows an example of an input signal spectrum applied to a DUT (device under test).

FIG. 7B shows the output of the DUT used in FIG. 7A, which may include at least one phase or frequency modulated signal.

FIG. 8A shows another example of a input signal spectrum applied to a DUT.

FIG. 8B shows the output of DUT used in FIG. 8A, which may include at least one phase or frequency modulated signal. This modulated signal may include a signal that is any one of many distortion products, for example.

FIG. 9A shows another example of an input signal applied to a DUT.

FIG. 9B shows the output of a DUT which include at least one signal component that can be measure for phase, frequency, and or amplitude modulation effect.

DETAILED DESCRIPTION

Figure 1A:
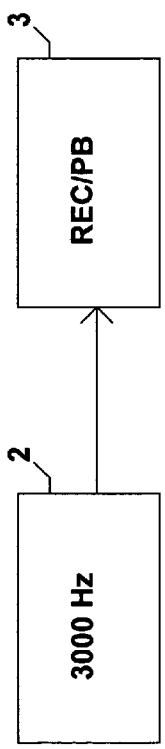
FIGS. 1A and 1B show a prior art configuration in testing frequency deviation effects via a Wow and Flutter meter.

FIG. 1A shows a standard prior art method of performing a Wow and Flutter test. A test tone signal, 2, of 3000 Hz (or 3150 Hz) tone is coupled to a recorder, 3. This recorder may be a tape recorder or a disc recorder.

Figure 1B:
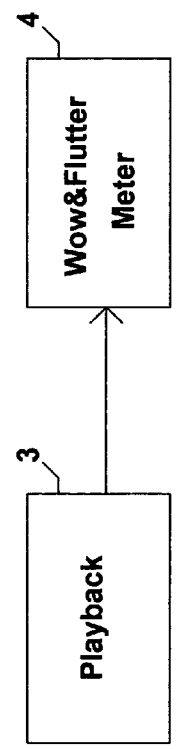

FIG. 1B shows further that the recorded test tone is then played back via 3 and coupled to a Wow and Flutter meter, 4, for measurement of frequency deviations of the singe tone (for a prior art standard method of measuring Wow and Flutter). These frequency deviations of the test tone are for example a result of the non-perfect speed or velocity in which the mechanical recorder exhibits upon recording and or playback.

One object of the invention is to assess phase or frequency modulation from an audio system or amplifier caused by the two or more input signals. Therefore, FIG. 1B, which shows standard (prior art) testing for Wow and Flutter, does not apply (for example, to a multiple signal method of an embodiment of the invention) because only one test tone signal is used (e.g., 3000 Hz).

Figure 1C:
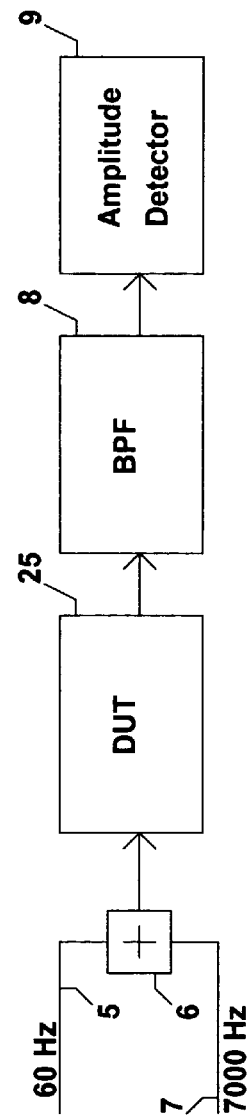
FIG. 1C shows a prior art method of using a two-tone test for measuring the amplitude of intermodulation distortion.

FIG. 1C shows a prior method of measuring the amplitude (but not phase or frequency modulation) of intermodulation distortion components on a two tone signal. In one example, a 60 Hz signal, 5, is combined with a 7000 Hz signal, 7, via a circuit 6, which is coupled to the device under test, DUT, 25, such as an amplifier. The output of the amplifier is then coupled to a filter, 8, to remove the 60 Hz component and pass a signal around 7000 Hz. The intermodulation distortion components are signals 60 Hz above and below the 7000 Hz signal from the DUT's output. These intermodulation distortion components then are measured for amplitude via an amplitude detector such as an amplitude modulation (AM) envelope detector, or an amplitude measuring system as denoted by block 9.

Note that there is another other two-tone intermodulation test such as coupling a 19 KHz and 20 KHz tone to the DUT to measure only the amplitude of third (and or second) order intermodulation distortion components.

Yet another object of the invention is to measure phase or frequency modulation effects of intermodulation distortion signals or tones, and or the test tones or signals from the DUT's output. The measuring of the phase and or frequency modulation effect(s) (e.g., of the any test signal frequencies and or of any distortion products from the DUT) is distinguished from (the prior art method of) measuring the amplitude or magnitude of intermodulation distortion products.

Another object of the invention is to measure the amplitude modulation/variation of any phase or frequency modulated signal from the DUT (e.g., with multiple signals).

Figure 2:
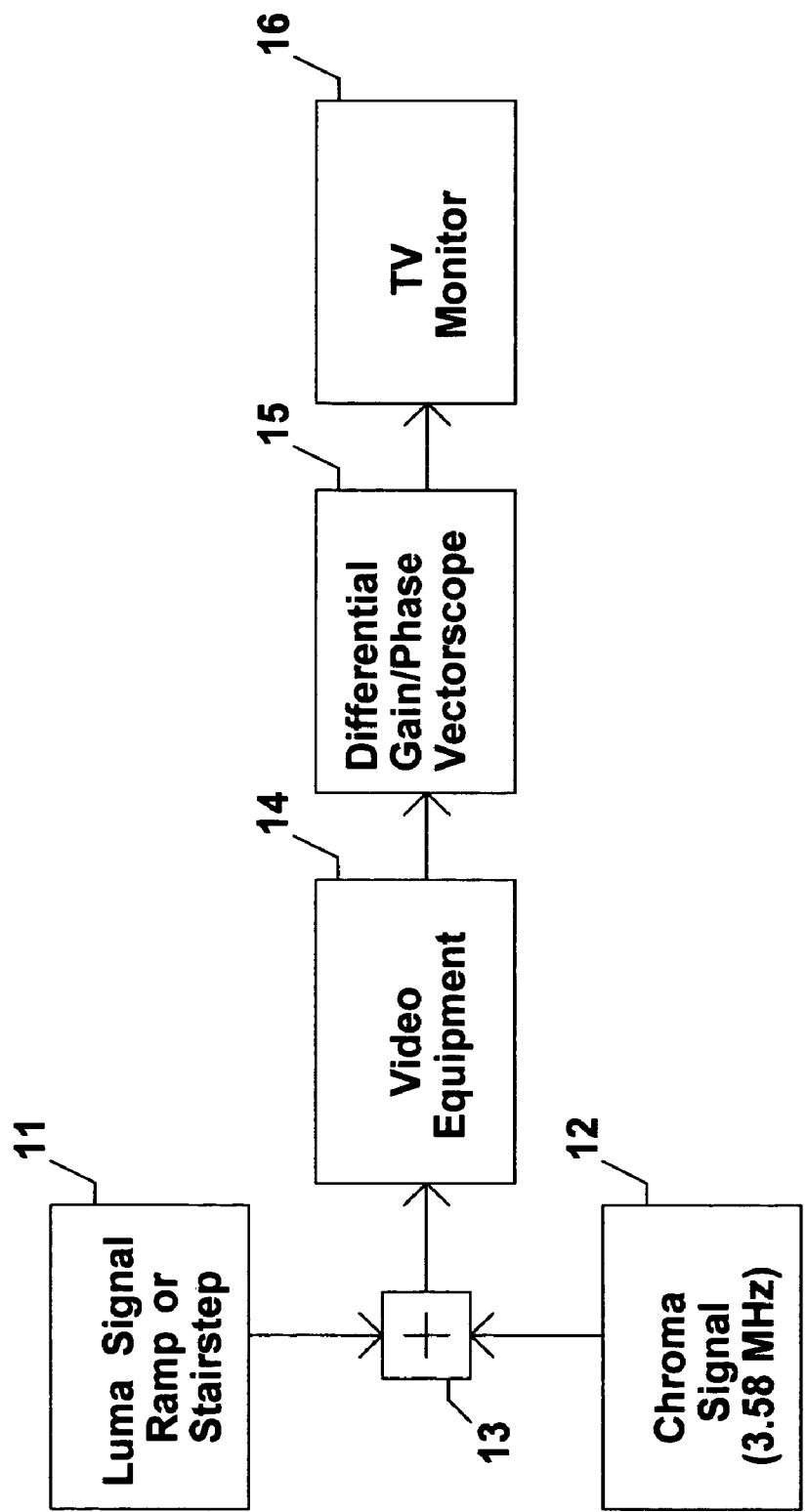
FIG. 2 shows a prior art method to measure phase distortion in a color video signal.

FIG. 2 shows a prior art standard test method for measuring differential phase or gain in a composite color video signal. Measuring different (color) gain is important to assess a shift in color saturation with changes in luminance or brightness values. And, measuring differential (color) phase is important in assessing a shift in color hue or tint with changes in luminance or brightness values. A low frequency luma signal, 11, (e.g., stairstep signal of ramp signal with a repetition frequency of 15.734 KHz or 15.625 KHz) is combined with a chroma color subcarrier signal, 12 (e.g., 3.58 MHz or 4.43 MHz). The chroma and luma signals are combined via circuit 13 and are coupled to a video equipment, 14. The output of 14 is coupled to a differential phase and or gain meter, 15, which filters out the luma signal, and uses a phase detector (e.g., no FM detector) to determine/measure phase or gain variations as function of varying brightness (luma) levels, which lead to color variations. The output of differential phase and or gain meter 15, which may be coupled back to the input of 15 (dashed line), may be coupled to a TV, 16, for monitoring.

FIG. 2 is intended for a video picture assessment for a color TV signal and its effects on color distortion. On the other hand, an object of the invention is to assess the effect of differential phase modulation on an audio signal, which can lead to a sonic (blurring) effect of music. Since measuring differential phase and or gain in an audio signal does not lead to the prior art's FIG. 2 intent to assess color distortion on a color TV signal (which is subsequently viewed on a TV set), the use and or objective of the invention is distinguished from the prior art shown in FIG. 2.

Another object of the invention is to assess the frequency variations of an audio signal that can lead to a sonic (blurring) effect. Note that this audio effect is not heard via a color TV signal (e.g., the video signal is beyond the bandwidth of audio hearing). Also, there is no "differential frequency" measurement for video signals. Thus, the invention is distinguished from video testing.

Also combining the prior art shown in FIGS. 2 and 1 will lead to a Wow and Flutter meter operating out of range because the video signal (>15 KHz) is too high in frequency. Applying the prior art 3000 Hz tone of FIG. 1 into the differential phase/gain meter of FIG. 2 will not work, because this tone is too low in frequency for video testing.

Figure 3:
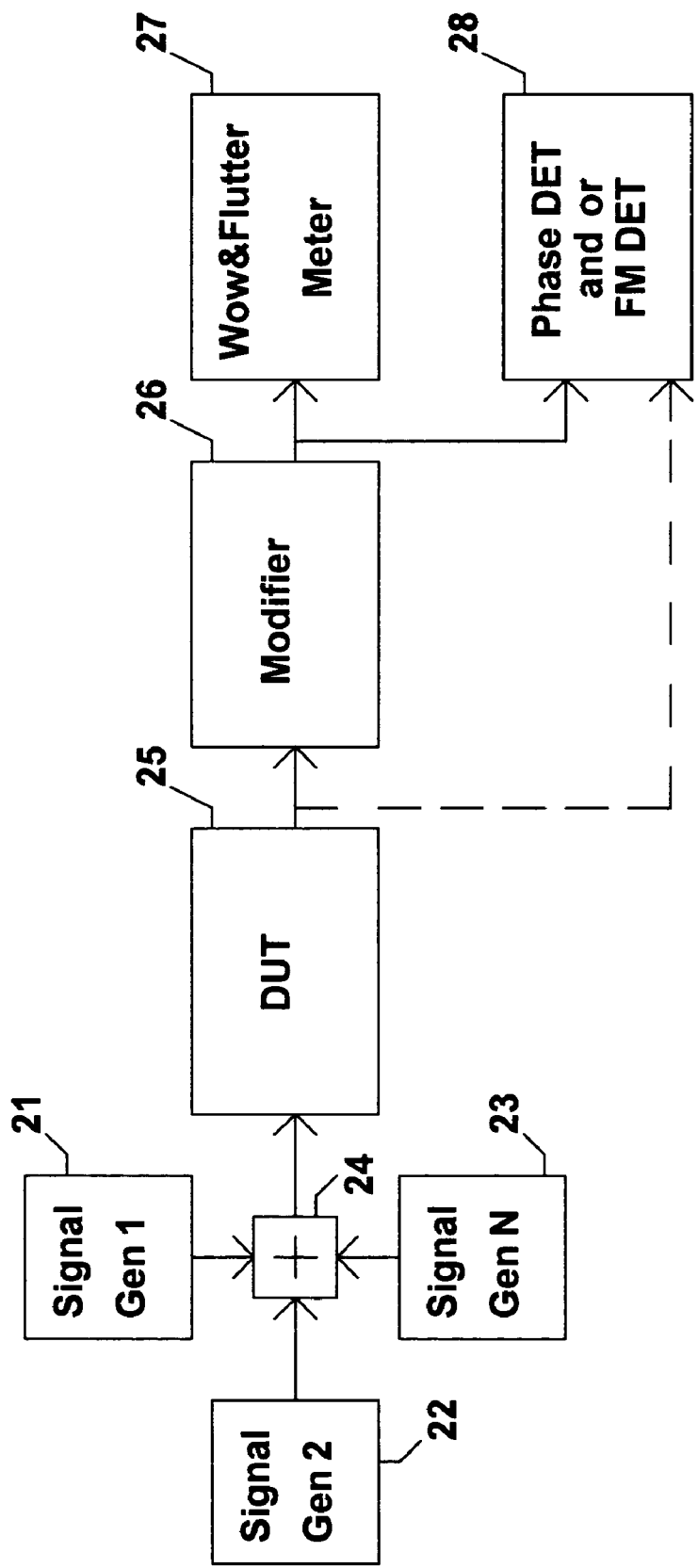
FIG. 3 shows an embodiment example of the invention.

FIG. 3 shows an example of the invention wherein multiple signal sources 21,22, and or 23 are combined or coupled by a circuit 24. Note that there may be (up to) N signal sources supplied to block 24. The output of combining circuit or apparatus 24 is then coupled to the DUT, 25, which may include at least one amplifier (e.g., an amplifier can be at least one amplifier stage), analog to digital converter, digital to analog converter, device (e.g., of previously mentioned),signal processor, and or storage apparatus. Because of the multiple tones coupled into the DUT, the output of the DUT 25 will (for example) include phase and or frequency modulation (e.g., a form of new distortion) for one or more signals at its output. The output of the DUT, 25, is then coupled to a modifier circuit or apparatus 26. Modifier 26 reduces or removes at least one interfering signal for measurement of phase and or frequency modulation. And the output of modifier 26 is then coupled to a Wow and Flutter meter 27 or to block 28, a phase and or frequency detector/discriminator.

The Wow and Flutter meter 27 may be of conventional type such as a Leader LFM-37A or a modified version of it to extend its frequency range. For example, a conventional Wow and Flutter meter measures frequency deviations based on a 3 KHz test signal with a 300 Hz bandwidth for the recovered frequency modulation effect(s). Thus for example, a Wow and Flutter meter can be modified for measuring frequency modulation effects of a 15 KHz test signal, with a 1500 Hz (or more) bandwidth for recovering the frequency modulation effects. Of course (these or) other (test) frequency signals may be used and or other recovered bandwidths may be provided (e.g., for the FM detector).

FIGS. 4A to 4F shows various ways of modifying a signal from the DUT.

Figure 4A:
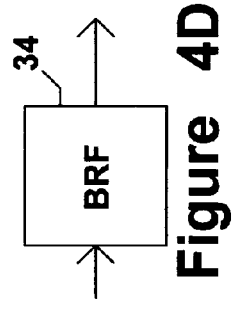
FIGS. 4A through 4F show various modification methods or circuits of the invention.

FIG. 4A is a bandpass filter, 31, to remove or reduce the amplitude of one or more signals out of its bandpass and pass through a signal or tone to the phase and or frequency (modulation) detector/discriminator (or Wow and Flutter meter). FIG. 4A for example may be set to tune to any frequency component from the output of the DUT, which may include any of the (input) test signal frequencies, and or any distortion products generated from the DUT. Thus, any of the tuned frequencies mentioned may be coupled to a detector for measuring modulation effects such as in phase and or frequency modulation (effects).

Using a filter, for example at least one band pass filter, and at least one detector (phase, frequency, and or amplitude detector) can reveal phase and or frequency modulation (or even amplitude modulation as well) of any (one or more) signal component from the DUT.

Figure 4B:
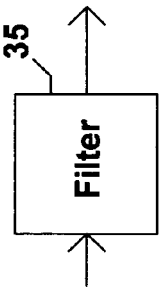

FIG. 4B shows an alternate way to measure the modulation distortion. A high pass filter, 32, is used to reduce or to remove unwanted signals, at least one lower frequency signal so as to facilitate a more accurate detection of phase and or frequency modulation distortion from the DUT. One advantage of using a high pass filter is that a wider bandwidth of phase and or frequency detection/discrimination can be achieved over a simple band pass filter. However, a more complex band pass filter can yield similar wider bandwidth recovery for the detector.

Although there are many types of frequency detectors which may be used for at least one embodiment of the invention such as tuned circuit ratio detectors, discriminators, peak differential, phase lock loop, and or quadrature detectors, there is also pulse counter FM detector.

The pulse counter FM detector generates a fixed width or duration pulse of a set amplitude and is triggered by the incoming signal at a particular slicing level. For example, if the higher frequency signal is adequately separated from the other signals at the DUT's output, a limiter circuit or comparator may generate a square wave signal. This squarewave signal then can be coupled to a timing generator such as one shot or half shot circuit. The output of the timing generator then produces a train of pulses of fixed width. If the higher frequency signal is incurring an FM effect, then the number of pulses per time will vary from the timing generator, which in turn when integrated or low pass filtered, will convert the frequency deviation (FM effect) into a demodulated output signal.

In another example of the embodiment for the detector, the positive and negative going edges of the square wave signal are coupled to two timing generators. The timing generator outputs are combined (e.g., a logic OR), which yield a pulse train of twice the frequency of the higher frequency signal (e.g., FH in FIGS. 7, 8, and or 9), which allows for wider band FM demodulation. This form of "double edge" FM demodulation is commonly used in analog video recorders. (For example see FIG. 17, latter portion).

For example, it is widely known in FM analog video recording systems, that as long as the first sideband (e.g., upper sideband) is recovered in the FM signal, a wide frequency response is achievable. For example, at a carrier frequency of about 8 MHz, a modulating frequency of about 4.2 MHz may be recovered with little distortion via this double edge technique.

Thus, an example would have a sharp cutoff high pass filter at about 1.6 KHz as the modifier block 26, and a double edge FM detector as block 28. The output of combiner 24 will have a higher frequency signal of 3 KHz or more, and a lower frequency signal of less than 1.55 KHz. The high pass filter will remove and or sufficiently attenuate any frequency at 1.55 KHz or lower. With this example, then it is possible to measure FM effects of the DUT caused by the lower frequency signal up to about 1.55 KHz even though the higher frequency signal (e.g., "carrier" into the detector) is at 3 KHz. In other words or in general, FM effects can be recovered (from a 3 KHz (carrier) signal or higher frequency) up to about a little more than one half of its own (e.g., "carrier") frequency (e.g., 1.55 KHz demodulated from a 3 KHz signal, but other frequencies may be provided or used).

Figure 4C:
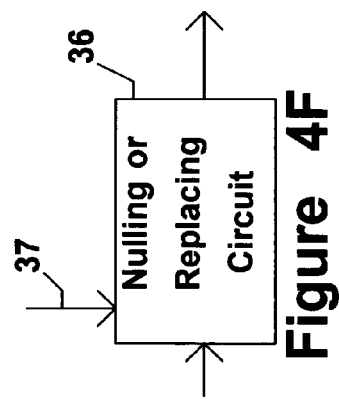

FIG. 4C shows a low pass filter, 33, as a modifier, which may be used to couple the lower frequency signal into a detector to measure phase, frequency, and or amplitude modulation effects. Also the low pass filter will remove the higher frequency signal while passing the lower frequency signal, (such) as a synchronizing signal from the DUT's output. (For example, see FIG. 12.)

Figure 4D:
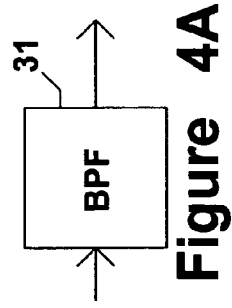

FIG. 4D shows a notch filter, 34, as a modifier. This notch or band reject filter may provide for rejecting or reducing one or more signal frequencies.

For example, a notch may reject the lower frequency tones and (or) any or all of the lower frequency signal's harmonics or other distortion products (e.g., intermodulation distortion components). In one example, the notch filter then passes at least one of the higher frequency signal's components (e.g., fundamental, harmonic(s), and or intermodulation distortion product (s).)

Figure 4E:
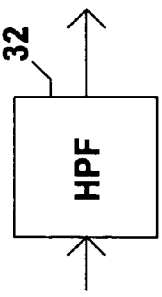

FIG. 4E illustrates a filter, 35, as a modifier. This filter may be any combination of the previously mentioned filters. FIG. 4E may denote a comb filter to pass through or reject one or more frequencies. In general, FIG. 4E represents a filter comprised of any combination of software, firmware, digital, and or analog techniques.

Note that any filter described in FIGS. 4A to 4E may be phase compensated for a flatter group delay characteristic. For example, phase equalization may be employed. Generally, a more linear phase response or flatter group delay characteristic will yield less distortion in PM and or FM demodulators (e.g., demodulators =detectors).

Figure 4F:
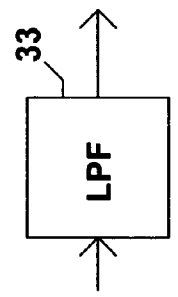

FIG. 4F denotes a nulling and or reducing circuit (method), 36, which may include cancellation.

One such method is to add a substantially out of phase signal or signals to at least partially cancel out one or more signals.

For example, circuit 36's input may be coupled to the DUT's output and a second input, 37, comprise of a lower (or higher) frequency signal from blocks 21 or 24 of FIG. 3. With the signal coupled to input 37, the phase is altered and amplitude is set to cause a cancel of at least part of the lower frequency signal from the DUT's output. In this example, the output of circuit 36, would comprise substantially the higher frequency signal(s).

Again, block 36 (or any of the blocks in FIGS. 4A to 4F) may be implemented in the analog, digital, and or software domain.

FIG. 5 shows a tunable receiver (or tuner), 41, with an FM, PM, and or AM detector. Block 41 then tunes into any of frequency of the spectrum to measure modulation effects on any of the signals produced by the DUT's output. The DUT's output may have the higher and lower frequencies and or their distortion products, harmonic and or intermodulation components. The tunable receiver 41 may be implemented with at least one filter, mixer, amplifier, oscillator, and or detector.

When the tunable receiver 41 is implemented to cover the audio range or higher, frequency, phase, and or amplitude modulation effects can be measured, stored, and or computed.

Block 41 and or any other part of the invention such as the blocks in FIG. 3 may be scaled for radio frequencies as well. In superheterodyne radio receivers, it is well known that the phase noise of a local oscillator can cause degradation in signal to noise of the demodulated signal. Thus this invention when scaled up to radio frequencies can measure frequency, phase, and or amplitude modulation effects on a receiving signal cause by other RF signals.

For example, an antenna picks up many channels of different frequencies(e.g., multiple signals). In some radio receivers, there is a varactor (variable capacitance) effect from the semiconductor mixer, RF amplifier, and or some tuned circuits. This varactor effect, which causes a change in capacitance versus a voltage across the semiconductor, then can induce incidental phase noise or extra frequency modulation, which can lead to extra noise at the demodulated output. Thus this invention can be applied to RF systems to measure phase noise for example (when two or more signals are involved).

FIG. 6 shows an alternative way of measuring standard distortions. Standard prior art tests measure harmonic, intermodulation at a single bias point of an amplifier or audio processor. Block 42 tests for harmonic and or intermodulation distortion products at a varying bias level. This varying bias level test via the block 42 can also be used to measure noise (e.g., noise output at various bias levels). The distortions and or noise measurements can then be stored, displayed, and or computed.

FIG. 7A shows one example of multiple signals applied into a DUT. The lower frequency signal has a frequency FL and a higher frequency signal has a frequency FH. In this example the amplitude of the FL signal is larger than the FH signal. However, the amplitude of either or both may be set to any level or any selected level.

FIG. 7B shows an output of the DUT, which may include an amplifier, device, at least part of a digital system, audio system, and or an RF system (e.g., which may generate harmonic and or intermodulation distortion due to a non-linearity). FIG. 7B then shows that there can be phase and or frequency modulation effects on the FL signal, FH signal, and or at least one harmonic of the FH signal, as denoted by the horizontal double arrows across each component.

For example the double arrows shows a $\Delta$FL, $\Delta$FH and $\Delta$2FH as a deviation or shift in frequency for those signals with frequencies FL, FH and a harmonic of FH. By use of a modifier (and or) detector, the deviation or shift in phase and or frequency may be measured.

It should be noted although not shown in FIG. 7A, it is possible to provide to the (phase or FM) detector (e.g., for measuring phase and or frequency modulation) any harmonics of FL and or FH, and or any intermodulation distortion component based on FL and FH.

FIG. 8A shows another example of multiple tones/signals, this time with more than two signals. Again, although the FL signal is denoted as larger in amplitude than the FH1 and FH2 signal, (other) amplitude levels may be set for any or all of the signals. In FIG. 8A, the use of more than two signals allows for measuring at least one intermodulation distortion component based on two higher frequency signals such as FH1 and FH2.

FIG. 8B then shows an example of at least some intermodulation and or harmonic distortion components based on FH1 and FH2 (e.g., caused by a non-linearity of a DUT). Not shown in FIG. 8B are other (e.g., intermodulation and or harmonic) distortion components (that may be coupled to a detector) based on any combination of FL, FH1, and FH2 (e.g. caused by non-linearity from a DUT). In FIG. 8B phase and or frequency modulation effect(s) can occur in the following but not limited to:

(FH2−FH1) (a second order intermodulation difference frequency),

FL, (2FH1−FH2) (a third order intermodulation difference frequency),

FH1,

FH2, (2FH2−FH1) (another third order intermodulation difference frequency).

Thus any or all of the above frequency components may be coupled to one or more (e.g., phase and or frequency) detectors. Modifier 26 may be used to ensure a more accurate measurement from any of the detectors.

The double horizontal arrows denote a representation of the shift or deviation (e.g., in terms of phase and or frequency) across each signal component.

Also, the signal deviation or shift (such as frequency deviation or phase shift) is denoted by the following:

$\Delta$(FH2−FH1) or $\Delta$FH IM2D $\Delta$FL $\Delta$(2FH1−FH2) or $\Delta$FH IM3DL $\Delta$FH1

$\Delta$FH2

$\Delta$(2FH2−FH1) or $\Delta$FH IM3DU $\Delta$nFH3A

$\Delta$nFH3B

$\Delta$nFL wherein n>=2 for example

Of course other distortion products may be coupled to the detector, such as sum and or difference intermodulation distortion components (e.g., of Nth degree distortion and of M signals) for measuring frequency and or phase modulation (and or amplitude modulation). Note that other or higher order harmonic distortion products or signals may be coupled to a detector.

FIG. 9A shows an example of a multiple signal test. In this example, the lower signal frequency FL3 is chosen to be lower than the frequency (FH3B−FH3A). These signals are coupled to the DUT.

FIG. 9B then shows an effect of the multiple tones on a DUT's output signal. In this example, the double arrows for each signal frequency designate a phase and or frequency modulation effect. FIG. 9B then shows that a modulation effect may be present not only at the input signal frequencies, but any or all of the distortion products. The distortion products shown but not limited to are the second order intermodulation distortion from FH3A and FH3B such as (FH3B−FH3A), third order intermodulation distortion products 2FH3A−FH3B, 2FH3B−FH3A, and or harmonic distortion products, nFH3A and or nFH3B (e.g., n>=2). These distortion products include any Nth order intermodulation and or harmonic distortion component(s).

Not shown in FIG. 9b, but can be included are the harmonics of FL (e.g., nFL) and the intermodulation distortion components related to FL and FH3A FH3B (FH3A+/−n'FL, FH3B+/−n'FL, 2FH3A+/−n'FL, 2FH3B+/−n'FL, and or other distortion products, wherein n'>=1). By using a modifier and or receiver/tuner 41, any of these signals or other signals (not shown) may be coupled to a detector for measuring phase and or frequency modulation effects. An amplitude measuring system such as a magnitude detector may be use to measure amplitude effects of the phase and or frequency modulated signals.

For each signal component in the spectrum a modifier such as modifier 26, may "process" the other signals as to reduce interference to a detector. The modifier may comprise filters and or cancellation methods/apparatuses. For example, in some DUTs, the frequency deviation may be large (such as due to any non-linearity, for example, any combination of cross over distortion point(s), near cut off, near saturation, or the like). With possible large frequency modulation effects from the DUT, it is desirable to have sufficient (to maximum) bandwidth around the signal that is coupled to the detector. It may be desirable to ensure sufficient attenuation of interfering signals.

For example, in FIG. 7B, we see that there are dotted lines denoting the 2nd, 3rd, and 4th harmonic of lower frequency signal whose frequency is FL. To optimize in measuring the recovered modulation (e.g., frequency modulation, FM and or phase modulation, PM) of FH, a modifier can comprise of a filter (and or cancellation circuit) to essentially remove or reduce amplitude of FL, 2FL, 3FL, and (or) 4FL (which may include 2FH). The filter can be made of a comb type band reject filter, multiple frequency notch filters, high pass, band pass and or notch filter, or the like.

From FIG. 7B, one can see it may be desirable to at least attenuate 3FL and or 4FL to avoid interfering with the (e.g., frequency and or phase modulation) detection of FH. The previous methods described above allows a wider bandwidth of recovery, whereas if one uses a narrow bandwidth band pass filter around the FH frequency, only a portion of the frequency and or phase modulation will be recovered. The reason is that a narrow band filter around an FM signal restricts recovery of the modulation.

In some cases a band-pass filter (of selected bandwidth) tuned to any signal component from the DUT's output may be sufficient for measuring phase and or frequency modulation effects (e.g., via a demodulator or detector).

Figure 10:
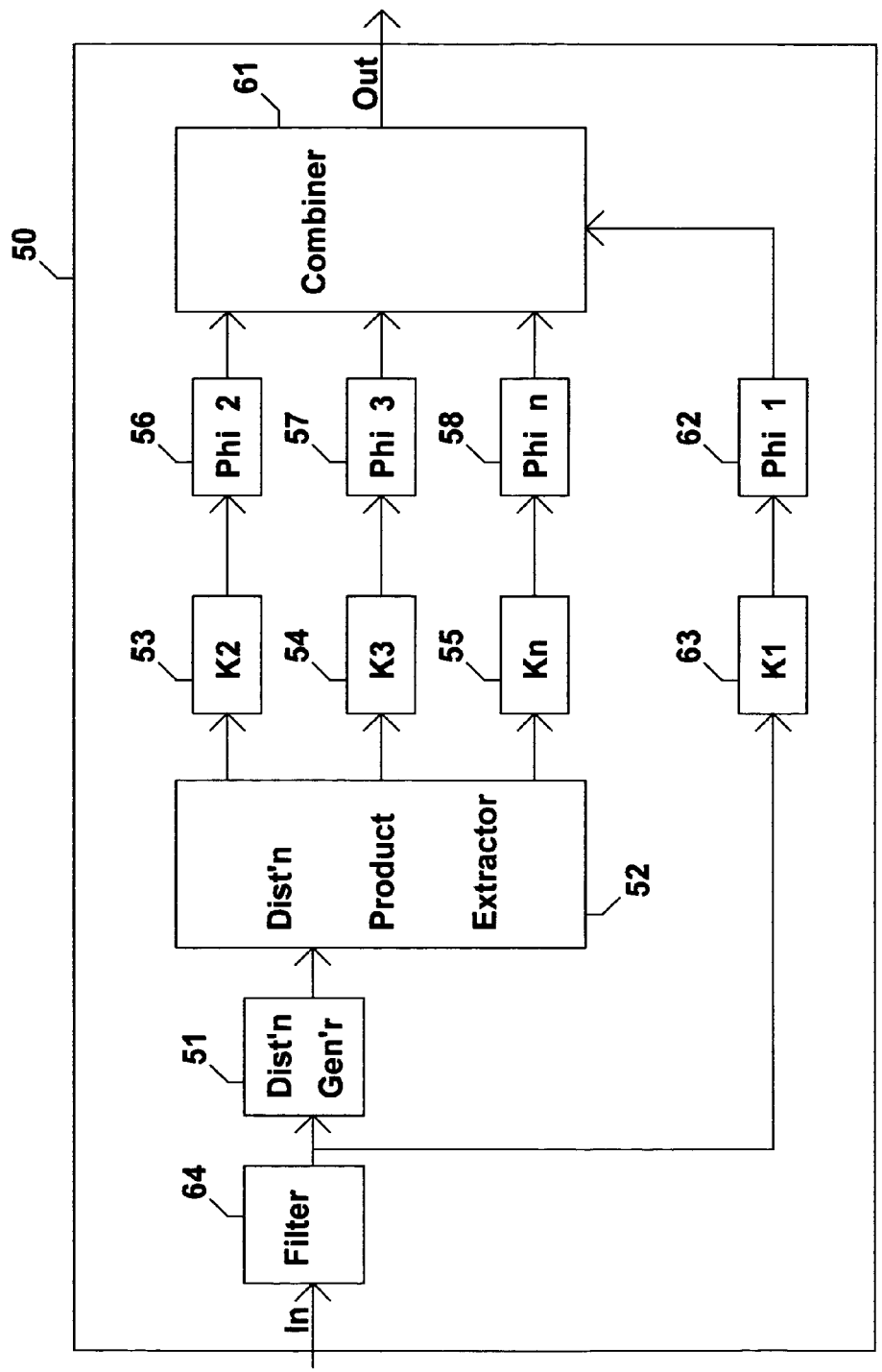
FIG. 10 shows a method to generate amplitudes of fundamental and or distortion products, which for example can be used to reduce various signals after the DUT's output.

FIG. 10 shows an apparatus/method, 50, to generate fundamental and or distortion products for reducing at least one interfering signal when the DUT is coupled to a detector. With the apparatus/method 50 combined with a modifier 26 or 26A, at least some cancellation occurs in one or more interfering signal.

An interfering signal for example, is a signal that reduces the measurement accuracy of (phase and or frequency) modulation effects (of a particular or selected frequency) from the DUT's output. For example in FIG. 7B if the 4th harmonic of FL is close in frequency to FH, then the subsequent detecting for modulation effects will be inaccurate. Because 4FL falls into a band pass of FH, an interference condition occurs that may cause an erroneous measured (frequency and or phase) modulation of FH. In general, a "carrier" signal may be the signal of interest for measuring a modulation effect. In this example, the signal from the DUT with frequency FH is considered as the carrier signal, and a harmonic of the signal FL that has a frequency of 4FL (which would be generated by a non-linearity from the DUT) is considered an interference signal.

In block 50, an input signal is (then) coupled to an optional filter, 64. The input signal is coupled to a distortion generator 51, which can comprise a waveform shaper, mixer, and or nonlinear function. The input signal may be a signal from the blocks 21,22,23, and or 24, or FIG. 3, and or the input signal may be from the DUT's output. Optional filter 64 may for example, then pass a particular signal through such as FL or FH.

In one embodiment, distortion generator 51 may generate harmonic distortion. In another embodiment, generator 51 may generate intermodulation and or harmonic distortion. The output of generator 51 is then coupled to a distortion product extractor, 52, which then output various distortion products (e.g., 2nd, 3rd, and or nth order harmonics (and or intermodulation components)) to a scaling factor and phase compensator or shifter apparatus comprised of blocks 53, 54, 55, 56, 57, and 58. Note as illustrated in FIG. 10, there are up to three outputs from the distortion extractor 52 shown, but more outputs may exist to couple to more scaling factor and phase compensator or shifter apparatuses.

The output of (any number of) the phase compensator circuits or apparatuses (e.g., 56 to 58 and or 62) is coupled to a combining apparatus 61. Also coupled to combining apparatus 61 is the output of phase shifter 62 via scaling block 63, which in this example represent a fundamental frequency signal. The output of combining apparatus 61 then may include any combination of fundamental and or (one or more) distortion products (e.g., harmonics and or intermodulation components), which can be used to then at least reduce interference signal prior to detection.

It should be known that the input of block 50 may contain more than one tone or signal. In this example, distortion generator 51 can generate intermodulation and or harmonic distortion products, and distortion extractor 52 can then extract intermodulation and or harmonic tones or signals. And the output of block 50 then can be comprised of harmonics and or intermodulation signal frequencies, which may be used accordingly to reduce a signal close (e.g., in frequency) to a (particular or selected) carrier (e.g., frequency) signal for detection.

By setting (any of) the scaling factor(s) K1-Kn, any test signal and or any distortion products may be reduced in amplitude or removed via a cancellation effect.

Also note that reducing amplitude or attenuating may include removal.

Figure 11:
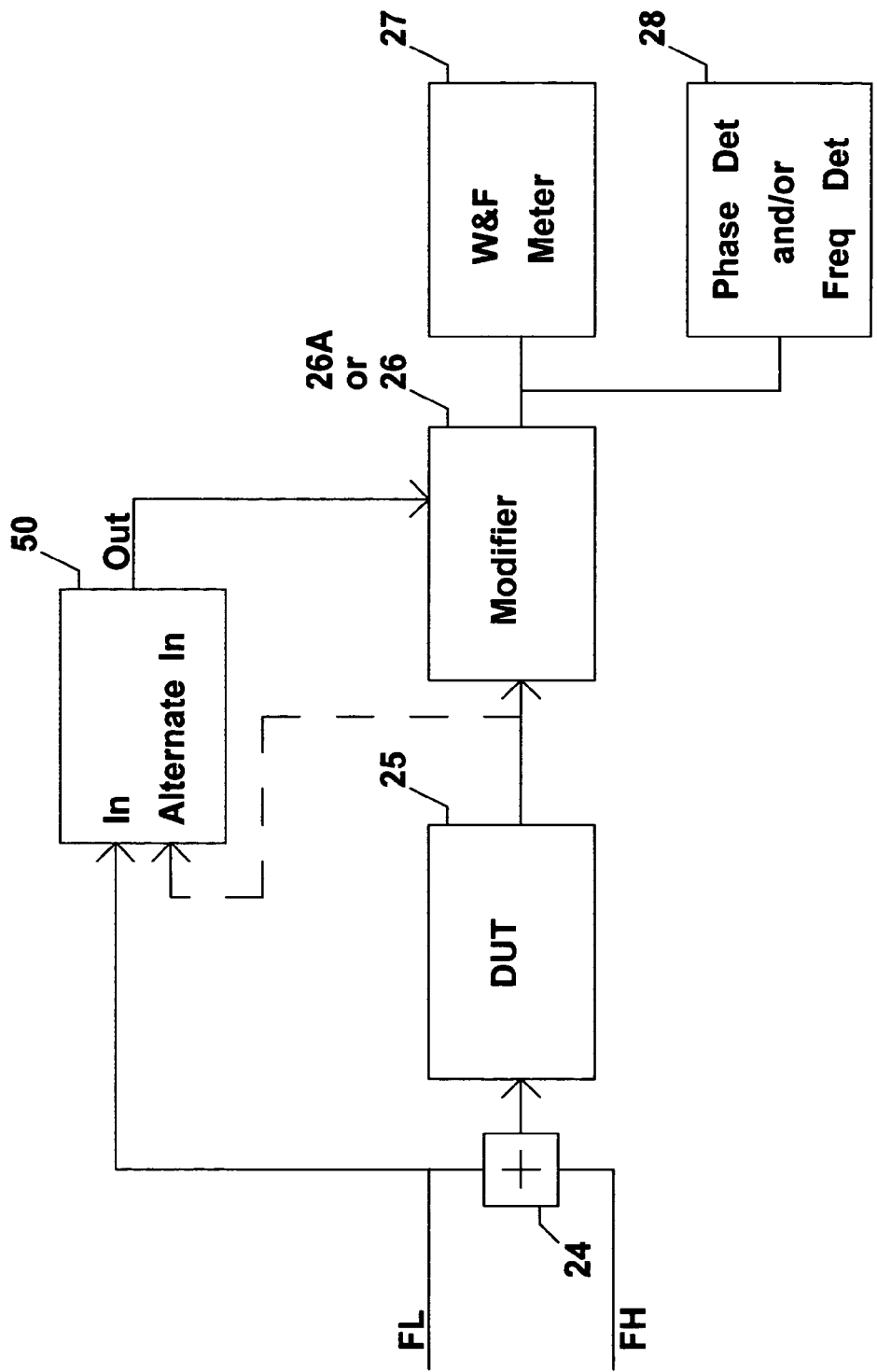
FIG. 11 shows a method to reduce the interference of at least one interfering frequency such that measurements may be made in terms of phase and or frequency modulation of one or more signals.

FIG. 11 then shows an example of block 50 of FIG. 10 for measuring a modulation effect from a DUT. In this example, signals including FL and FH (but not limited to) are combined or summed via a combining circuit 24. Signal FL is coupled to block 50, which outputs any combination of fundamental and or distortion products (e.g., 2nd, 3rd, 4th, and or nth order harmonic and or intermodultation). The output of block 50 then has via the scaling block(s) close to the amplitude of the harmonic distortion (and or intermodulation distortion) from the DUT's output. The output of block 50 may then have (essentially) the same or opposite phase of the fundamental and or harmonic(s) (and or intermodulation distortion product(s)). The DUT output is coupled to an input of the modifier 26 or 26A, and another input of the modifier is coupled to block 50's output. If the modifier is a summing apparatus, then the phase shifter/compensator blocks from block 50 are set to be about out of phase to cancel signal with frequency FL and or at least one harmonic of the signal with frequency FL. And if the modifier is a subtracting apparatus, the output of block 50 will be set for about the same phase so that the modifier may reduce or cancel the frequencies at FL and or its harmonics.

With frequency components around FL and or its harmonics reduced sufficiently at the output of the modifier, the frequency component around FH (in this example) is then coupled to the Wow and Flutter meter and or FM/PM detector (e.g., for a wider frequency range of the recovered (FM and or PM) modulation effect on the signal with frequency FH).

Figure 12:
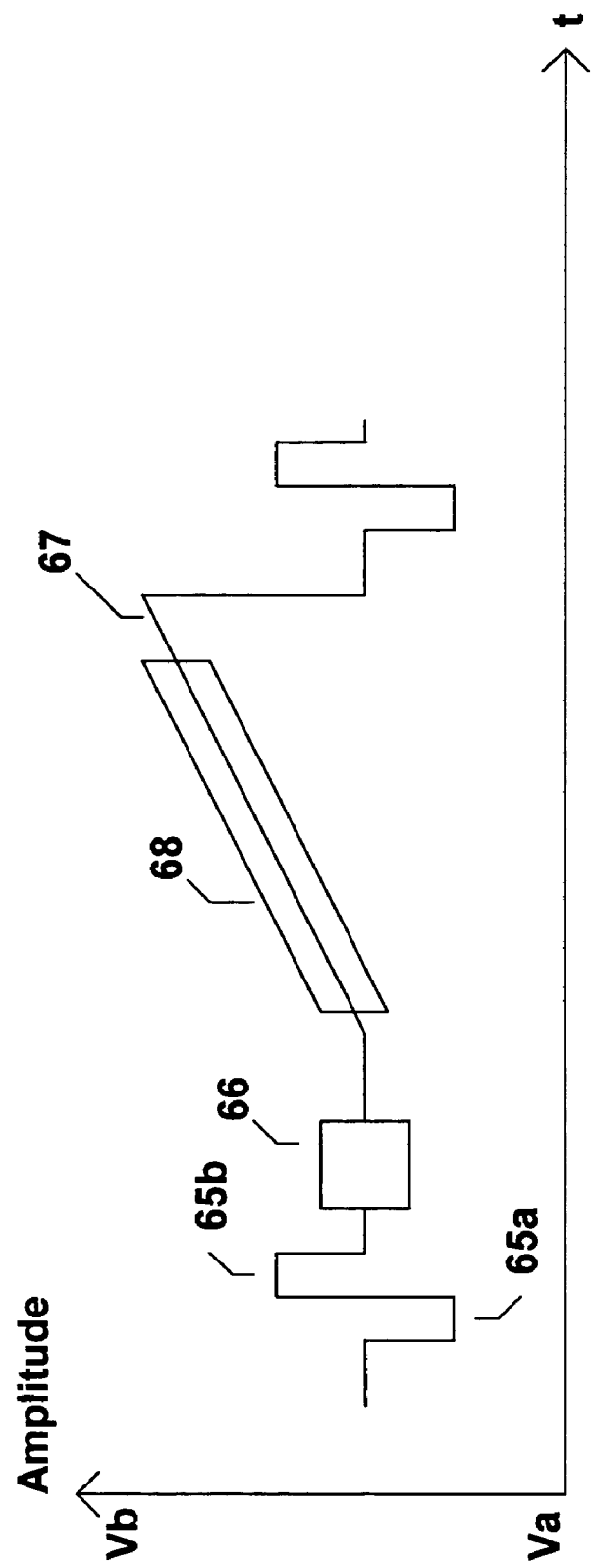
FIG. 12 shows an example test waveform that may include at least one reference signal.

FIG. 12 shows an example waveform for an audio or RF test signal to measure for phase and or frequency modulation effects. An optional sync signal, which may be bipolar as shown by numeral 65a, 65b, can also be a unipolar sync signal (e.g., such as 65a or 65B). A lower frequency waveform such as a ramp or sawtooth signal is shown at 67. A high frequency reference signal is shown at 66, which may contain one or more packets of more than one frequency signal. Also shown is a higher frequency signal, 68, added or superimposed on a portion of the lower frequency signal, 67. Signal 68 may be comprised of more than one frequency in sequence and or in combination. Signal 67 may be comprised of a sinusoid or arbitrary waveform.

Example frequencies of the waveform shown in FIG. 12 can have period of the waveform of 1/30 of a second, the low frequency ramp, 67, may be about 20 to 30 milliseconds in duration, and sync pulse width (65) may be 2 to 5 milliseconds in duration. Reference signal 66 may have a duration of 1 to 5 milliseconds and with frequencies of 5 KHz, 7 KHz, 10 KHz, and or 15 KHz. Signal 68 may have frequencies similar or the same as reference signal 66. Amplitudes of each signal, 65, 66, 67, and or 68 may be set to any level.

Of course, other waveforms, signals, time durations, and or amplitudes may be used.

One advantage of a signal such as in FIG. 12 is that at least one reference high frequency signal is carried along with this test signal (that then does not require an external reference source such as a reference signal from generators 21, 22, or 23 of FIG. 3), which allows testing of equipment that may include storage or memory, or wherein the output of the DUT is not synchronized with the input. For example, in a storage system, the output of the DUT may output the input signal with a slight different frequency "error"(e.g., 1000 Hz in, 1001 Hz out). Thus, taking a reference phase from an FH signal at the input to make phase modulation measurements will be invalid. But instead, the reference signal 66 is used to generate a continuous high frequency signal for phase detection, wherein the phase (modulation) measurement would be valid since the reference signal (e.g., 66) would encounter the same slight frequency "error" output caused by the DUT.

Note that although FIG. 12 may look similar to a video signal circuit, the present use for devising such a signal is to measure modulation distortion in audio and or RF systems or devices.

On the other hand, in video a (prior art) video test signal is used to measure color saturation or tint effects on a color subcarrier TV signal with a luma signal.

However, in audio, a signal such as shown in FIG. 12 would be used to measure phase and or frequency modulation effects that would cause a sonic or audible characteristic. And in an RF system, extraneous noise may be measured because of phase and or frequency modulation effects, which lead to phase noise that can degrade signal to noise ratio.

Note that FIG. 12 is an illustration by way of example only, and other waveforms may be synthesized. One aspect of FIG. 12 is to carry at least one higher (and or lower) frequency reference signal along with at least one test signal. A synchronizing signal may be added to the test signal, but may not be required. For example, recovering a lower frequency signal via filtering or reducing the amplitude of the higher frequency signal(s) can provide a sync signal. Alternatively, removing or reducing the lower frequency signal may allow using one or more of the higher frequency signal(s) to provide a sync signal.

Figure 13:
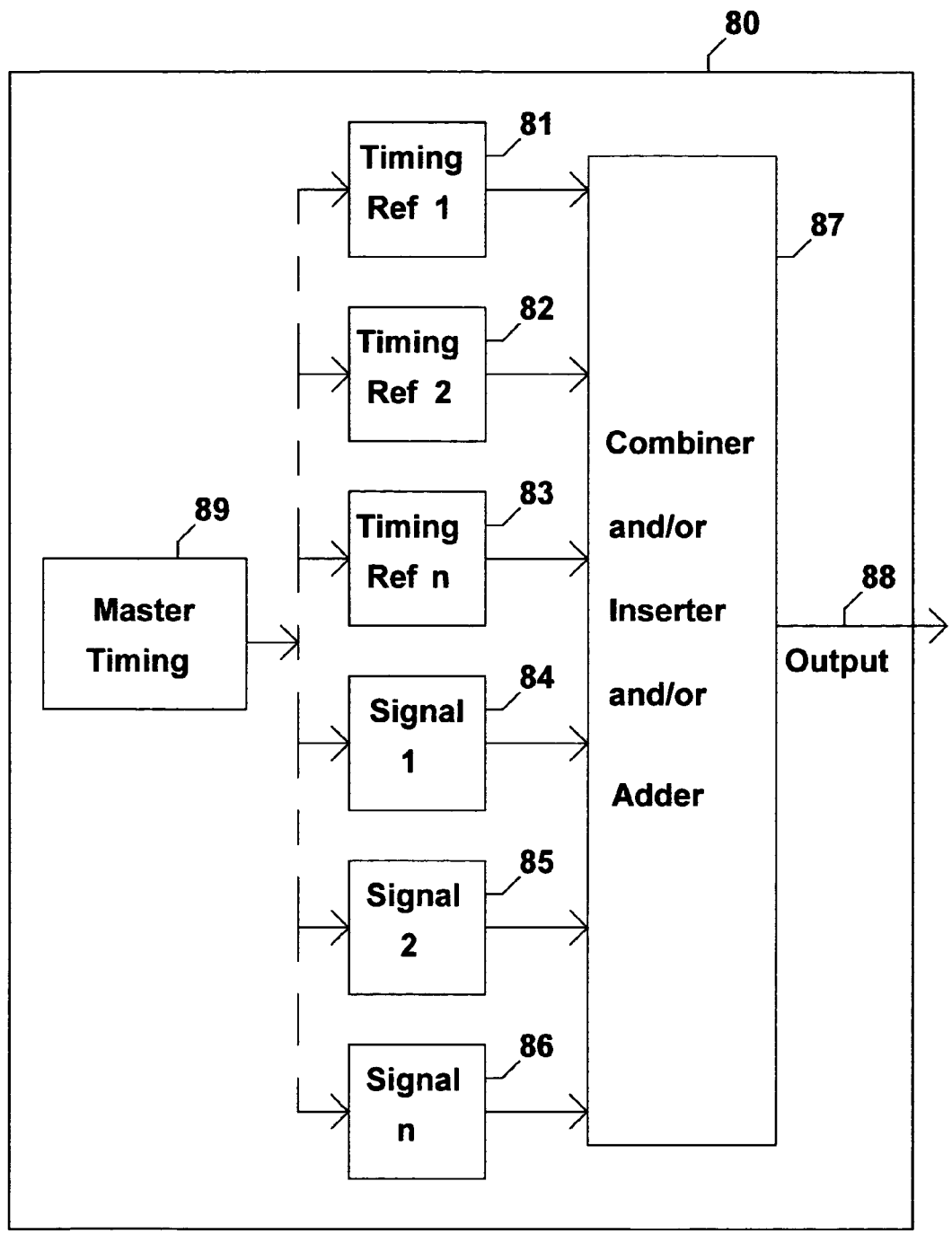
FIG. 13 shows an example of the invention method and or apparatus to generate a test waveform.

FIG. 13 shows an illustration of an apparatus, 80, to generate a test signal (e.g., FIG. 12 or other waveform) for measuring modulation effects on at least one particular signal or tone.

One or more reference timing signals is provided by blocks, 81, 82, and 83. Block 83 represents that up to (n or) "n0" reference timing signals can exist. These timing signals may include a synchronizing signal, and or at least one reference high and or low frequency signal in a form of a packet or packets or an arbitrary waveform.

Test signal sources (that may be comprised of low, mid, and or high frequency signals) are provided by blocks 84, 85, and or 86. Again, block 86 indicates that there may be up to (n or) "n1" test signal sources.

A combiner, adder or inserter block 87 receives the reference timing and test signal sources to output a test waveform via 88. This test waveform can then resemble part of or all of FIG. 12, or this test waveform from 88 may produce another waveform.

Also shown is block 89, which allows synchronizing the various reference and or signal timing sources. For example, block 89 may provide the order (e.g., sequence) when each reference and signal source occurs in a generated waveform at the output 88.

Block 89, 88, and or 80 may also provide sequence a different waveform at start of the next reference timing period (e.g., synchronizing or reference frequency signal).

Figure 14:
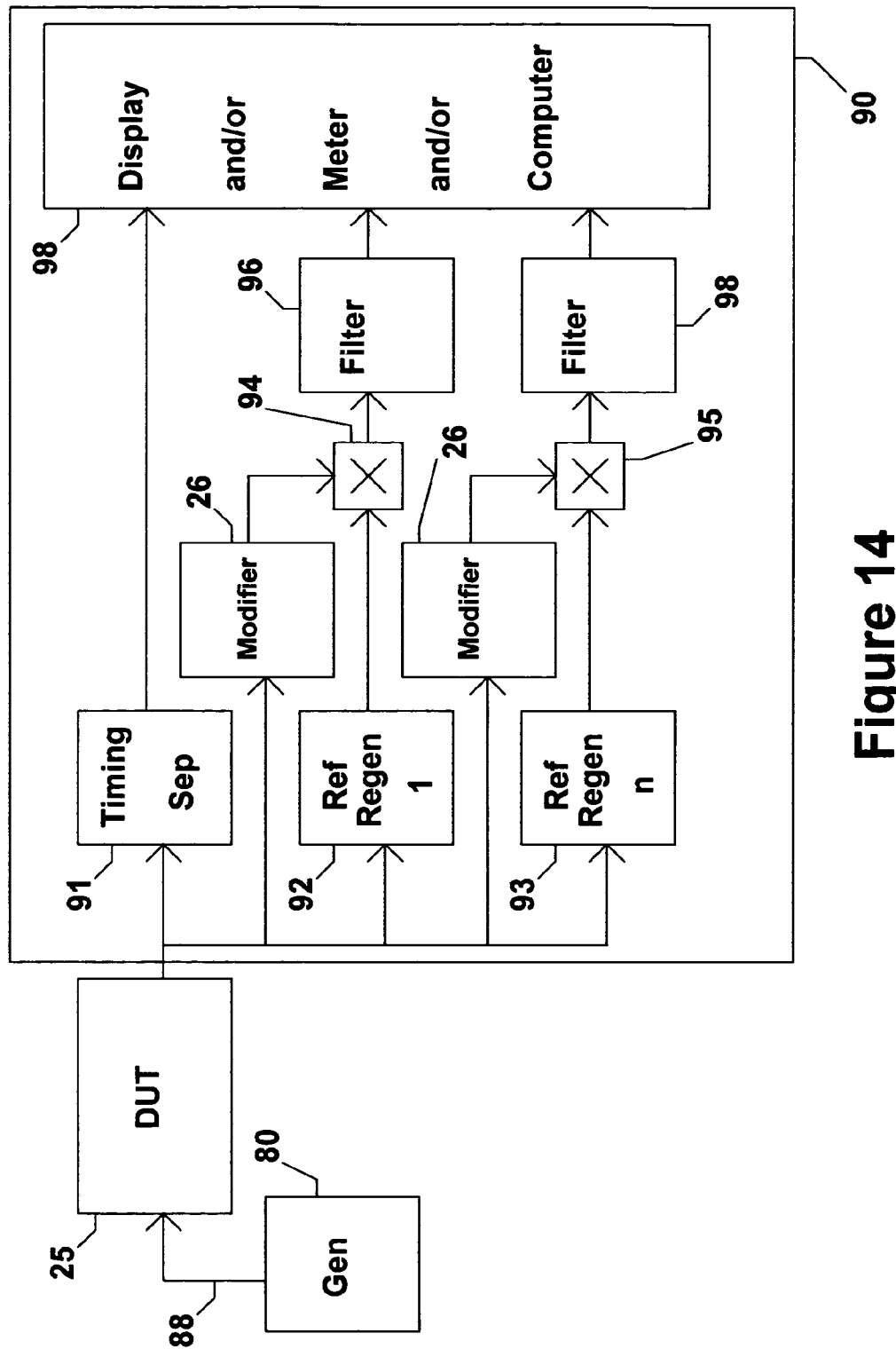
FIG. 14 shows an example of the invention that can measure phase and or frequency modulation

FIG. 14 shows a measurement system, 90, that utilizes a test waveform from generator 80. Output 88 is coupled to the input of a DUT, 25. The output of the DUT is then coupled to an input of 90. Thus the DUT's output is coupled to a timing separator 91, and one or more reference signal regeneration circuits, 92 and or 93. Block 93 represent that there can be as many as "n" reference signal regeneration circuits. An example of the reference regeneration circuit (e.g., phase lock loop, oscillator, or the like) is to provide signal (e.g., of a (fixed) phase and amplitude) that extends in duration beyond the reference signal packets, such as 66 of FIG. 12. The output of one or more reference signal regeneration circuit is then coupled to one or more mixer or multiplier or non-linear circuit (e.g., 94 and or 95) to provide phase detection of the DUT's output (e.g., from a selected signal from DUT 25). So circuits 94, and or 95 receive(s) a coupled signal from the DUT's output via a modifier such as 26 or 26A. The modifiers remove an interfering signal component prior to the input of circuits 94 and or 95. The output phase detector 94 and or 95 is coupled to a filter (e.g., 96 and or 97) of particular bandwidth.

The output of filter 96 and or filter 97, and a timing signal from timing separator 91 are coupled to a measurement system, display, meter, and or computer to measure, display and or compute the DUT's phase variation as a function of a lower frequency signal such as a ramp or other waveform. If the slope of the phase or derivative of the phase variation is taken (e.g., by a differentiator circuit and or by computation), a frequency modulation variation as a function of the lower frequency signal may be provided.

Figure 15:
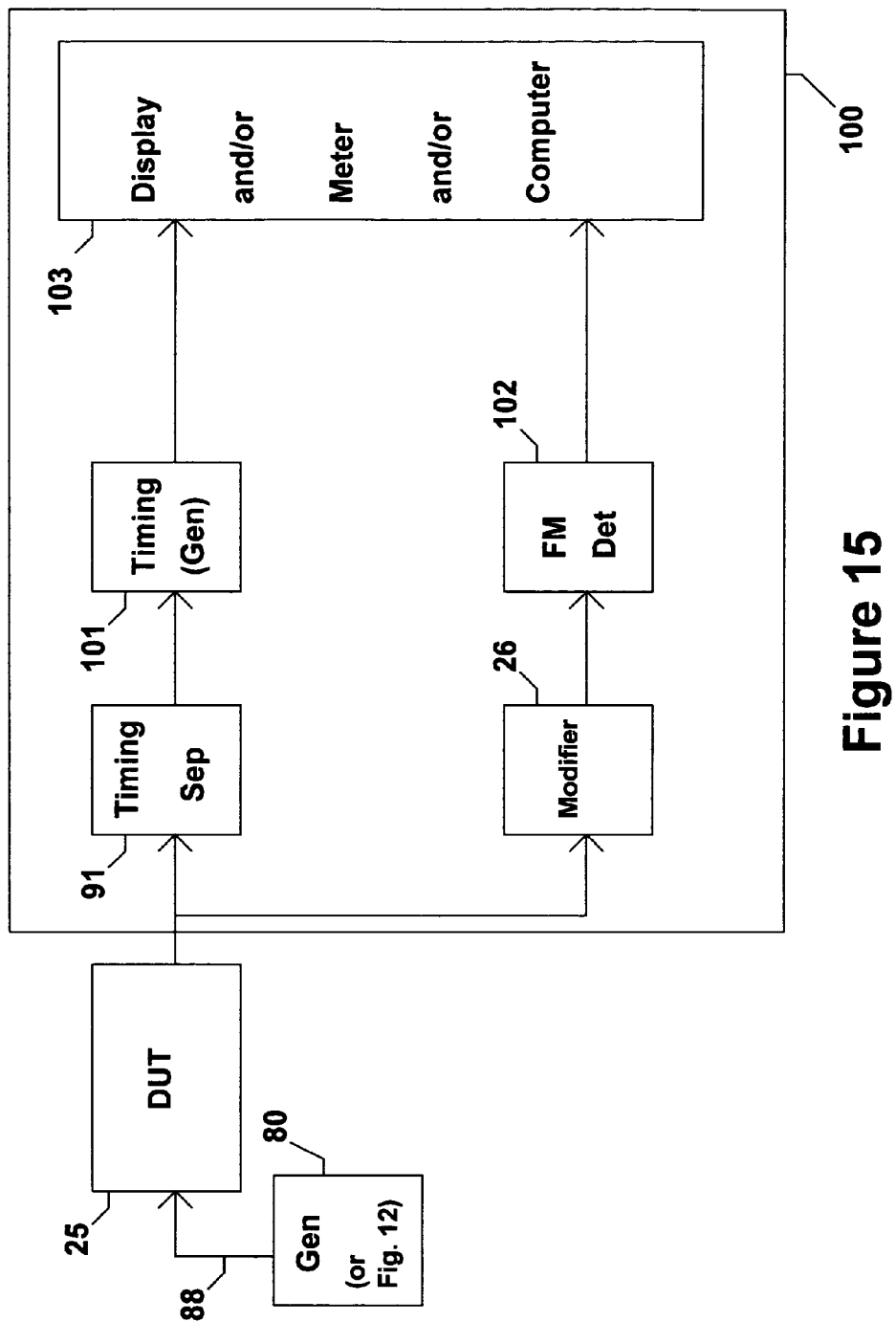
FIG. 15 shows an example of the invention that can measure frequency or phase modulation.

FIG. 15 shows an example of using waveform generator 80's output to measure frequency modulation effects from a DUT. The signal 88 is coupled to the input of the DUT, 25, whose output is then coupled to system 100, which includes a timing reference circuit 91 and a modifier 26. The output of the timing reference circuit 91 is coupled to an optional timing circuit 101. The output of the modifier 26 is coupled to an FM detector, 102. Display, meter, and or computer 103 is coupled to the timing reference signal and to the output of FM detector 102. Block 103 then can measure and or display a frequency deviation or shift of a signal or tone as a function of a lower frequency signal such as signal 66. By integrating (e.g., via an integrator circuit and or by computation) the FM detector's output, a phase variation measurement may be provided. Note that one or more FM detectors may be used for system 100.

Figure 16:
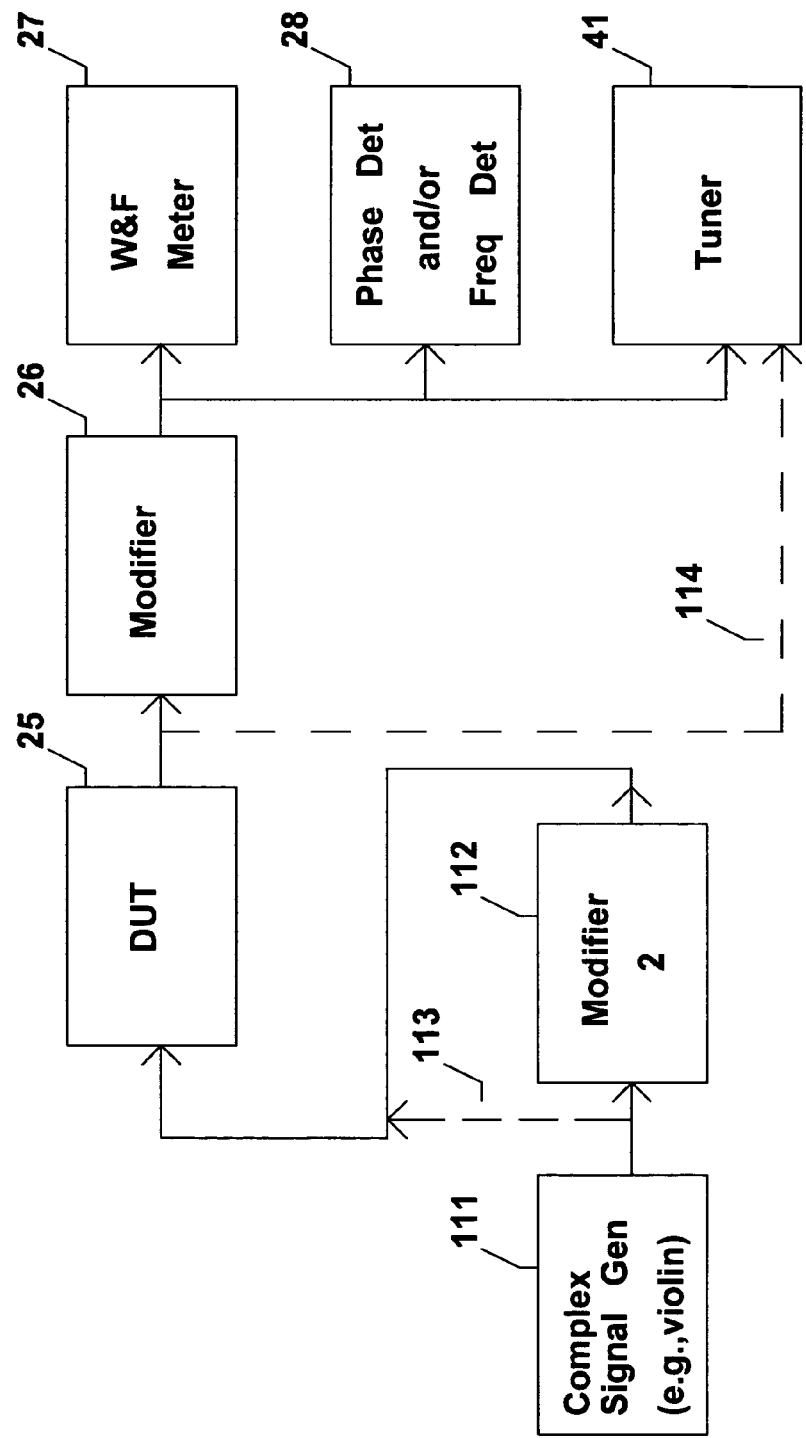
FIG. 16 shows an example of using a complex signal to test for phase and or frequency modulation of one or more selected signals.

FIG. 16 shows another example for testing for modulation effects based on two or more frequencies. Block 111 represents one or more complex signals. A complex signal may include music. For example, block 111 may include a violin or other musical instrument's note or notes. In a violin, an "A" 440 Hz note has a fundamental frequency much larger in amplitude over its harmonics.

For this example, in general, this complex (440 Hz) signal is then coupled to a DUT via line 113. The output of the DUT is then coupled to a modifier, 26, which reduces the amplitude of the fundamental and or other harmonics. A (remaining) selected harmonic (e.g., 10th harmonic at 4400 Hz or 20th harmonic at 8800 Hz) is to be coupled to a Wow and Flutter meter 27 (e.g., a modified Wow and Flutter meter to measure beyond a standard 3 KHz signal), a phase and or FM detector 28, and or a tuner/receiver, 41 (for measuring modulation effects such as PM and or FM and or Wow and Flutter).

Note the tuner/receiver 41 may be coupled to the output of the DUT, and tuned to the various harmonics and or fundamental to measure for modulation effects (e.g., phase and or frequency shifts).

In another variation or example of this test method and apparatus utilizing one or more complex waveforms from block 111, the output thereof is modified via a modifier 112 to reduce or remove one or more (signal) frequencies prior to coupling to the DUT. The output of the DUT is then coupled to the modifier 26 or 26A to remove any interfering signals prior to meter 27 (e.g., for Wow and Flutter measurement on a selected frequency) and or FM detector 28 (for measuring modulation effects). Tuner/receiver 41 may be coupled to the output of the DUT (or to the output of modifier 26 or 26A) for measuring any modulation effects (e.g., phase and or frequency shifts) of any signal from the DUT.

It should be noted that the complex signal source 111 may include one or more "voices" or musical instruments.

Thus, source 111 may be substituted for any of the signal sources previously mentioned (e.g., 111 may substitute for the sources 21, 22, and or 23; 67 and or 68; 84, 85, and or 86; or the like).

It should be known that a source such as 111 may be used in conventional testing such as harmonic and or intermodulation distortion measurements with or without a variable bias condition.

Figure 17:
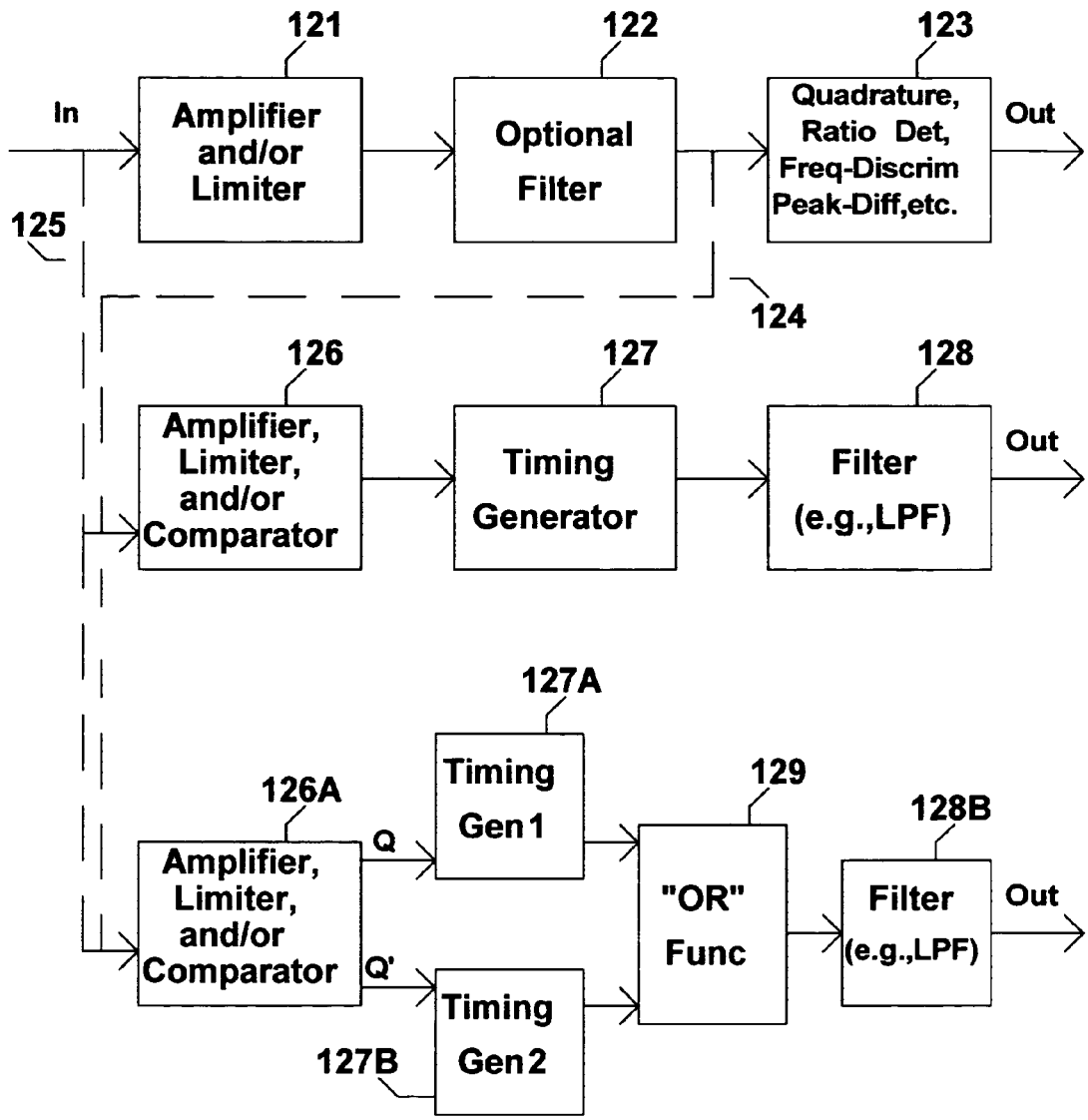
FIG. 17 shows one or more ways to detect or demodulate a signal that has a frequency modulation effect.

FIG. 17 shows various ways to detect or demodulate an FM signal. A signal 125 coupled via the DUT's output (e.g., and is sufficiently free of interfering signals for detection of a particular carrier or selected signal/tone) is coupled to an amplifier and or amplitude limiter amplifier, circuit 121. The output of circuit 121 is coupled via an optional filter 122 to a detector 123. Block 123 may be implemented in terms of a phase detector, quadrature detector, ratio detector, slope detector, regenerative detector, discriminator, phase lock loop, peak differential detector, and or a frequency to voltage/current converter.

One example of a frequency to voltage/current converter is shown by blocks 126, 127 and 128.

A second example of a frequency to voltage/current converter is shown at numerals 126A, 127A, 127B, 129, and 128B. Both examples shown are also known as pulse counter (FM) detectors. In particular the second example (via block 128B) is used in analog video recorders, and has an advantage of recovering a wider bandwidth than the first pulse counter detector (via block 128) or many of the examples of detector 123.

For the first (example) pulse counter detector, a (limiter) circuit 126 is coupled to the signal 125 from the DUT, which may include a modifier 26, or block 126's input may be coupled to the optional filter 122. The output of amplifier, limiter, and or comparator 126 is then coupled to a timing circuit, which generates a fixed duration pulse (triggered from either edge of block 126's output). The output of block 127, which is a train of fixed width pulses, is coupled to a low pass filter 128, which then provides a voltage in proportion to the frequency of the carrier or selected signal or tone. If the selected signal or tone shifts up in frequency, more pulses per time will occur and the low pass filter output will increase. If the selected signal or tone shifts down in frequency, less pulses per time from block 127 will occur and the output of low pass filter 128 will decrease.

The second example of pulse counter (FM) detector receives the signal 125 (dashed line) and utilizes both rising and falling edges (e.g., of the selected carrier signal) via -the comparator/amplifier/limiter 126A's (complementary) outputs. Each 126A output is coupled to a timing generator 127A and 127B, and both 127A and 127B deliver a fixed pulse duration for its output. A logic OR (function) circuit 129 is coupled to each output of the timing generators, and the output of circuit 129 then is a double rate or double frequency FM signal from the selected tone or signal. With the double rate signal, the bandwidth for the low pass filter 128B may be extended (e.g., over filter 128), for a greater recovered information.

In some tests of DUTs that may include crossover, quantizing, and or clipping distortion, the second pulse counter detector (e.g., via 126A,127A,127B,129, and 128B) is more desirable in that the discontinuous (wider band width) nature of the phase and or frequency modulation effect is more faithfully reproduced.

Other types of testing may include a modulated waveform such as AM, PM, and or FM coupled into the DUT with or without dynamic biasing for measuring any extraneous sidebands, and or any deviation from the recovered modulation, which may include harmonic and or intermodulation distortion and or phase and or frequency modulation effect(s). The dynamic biasing may include a period waveform, an arbitrary or programmed waveform, and or at least one modulated signal.

Figure 18A:
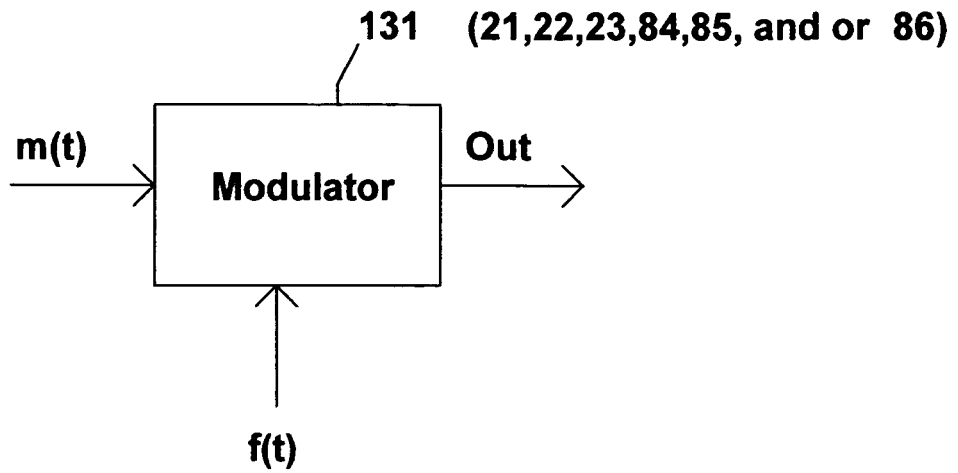
FIG. 18A shows a modulator, which may provide a modulated signal source.

In terms of another signal source or sources, any of the previously mentioned signal sources may be a modulated signal source. As shown in FIG. 18A, a modulated signal source with a modulating signal m(t) and a "carrier" frequency signal f(t) may be used. The output of FIG. 18A or 131 may then provide an amplitude, frequency, and or phase modulated signal (e.g., for coupling to a DUT). The output of 131 may serve as a signal source for any waveforms in FIG. 12 (e.g., 131 output, a modulated signal may be used for 66, 67, and or 68). (It should be noted that a modulated signal may include a zero modulation.)

For example, an amplitude modulated signal (e.g., for coupling to a DUT) may include single sideband, double sideband suppressed carrier, double sideband with carrier, and or a vestigial amplitude modulation. Amplitude modulation may include pulse amplitude modulation and or a variation of a carrier signal's amplitude level.

For phase modulation, examples may include I and Q type phase modulation, phase shift keying modulation, or simple phase modulation. Examples of frequency modulation may include narrow and or wide band frequency deviation and or frequency shift keying modulation. Frequency and or phase modulation may include vestigial frequency and or phase modulation.

Other examples of modulation may include pulse code modulation (e.g., for block 131)

In an example for amplitude modulation, a continuous tone signal of 3 KHz and an amplitude modulated 16 KHz signal was combined and coupled to a DUT (e.g., a two transistor amplifier of previous mention.). In the previous example, it was shown experimentally that a lower frequency signal combined with a higher frequency signal caused an induced phase and or frequency modulation effect on the higher frequency signal. In this example, the amplitude modulated higher frequency signal caused an induced phase and frequency modulation effect on the lower frequency signal. In one experiment a 100 Hz sine wave (e.g., m(t)) amplitude modulated a 16 KHz signal (e.g., f(t)) to generate this amplitude modulated signal that is combined with a 3 KHz signal for the DUT's input signal. With a band pass filter or modifier (e.g., to remove the 16 KHz amplitude modulated signal and pass through the 3000 KHz signal) coupled from the output of the amplifier or DUT to a Wow and Flutter meter, and it was found that 0.03% Wow and Flutter was measured. Again, this is an expected result (e.g., normally it would be expected that an electronic amplifier has Wow and Flutter =0.000%, or an amplifier should exhibit no Wow and Flutter) in that a higher frequency signal induces a phase and or frequency modulation onto a lower frequency signal. It should be noted that a frequency, (and or phase) modulated signal may have been used to modulate a signal. For example, many devices may exhibit a variation in frequency response. A frequency (or phase) modulated signal will then cause a incidental amplitude modulation effect when the device has a variation in frequency response, which will cause a (differential) phase or frequency modulation effect on another signal from the device. For example, a envelope variation of a carrier frequency signal can induce phase or frequency modulation effect(s) on another signal. The envelope may include two or more signals added to form an envelope to cause a modulation effect (e.g., on another signal such as a lower and or higher frequency signal).

Figure 18B:
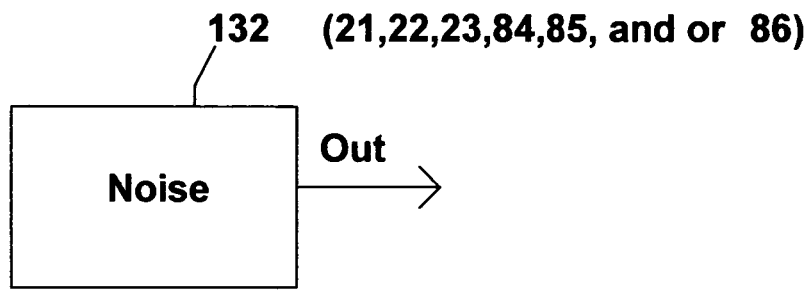
FIG. 18B shows a noise generator, which may provide a noise signal source.

FIG. 18B shows that any of the signal sources may include a noise generator. The noise source as a signal source may include filtering to shape one or more types of frequency responses. In one example, a noise source may be substituted for any of the previously mentioned signal sources and or used for a modulating signal source such as m(t) in FIG. 18A.

Figure 18C:
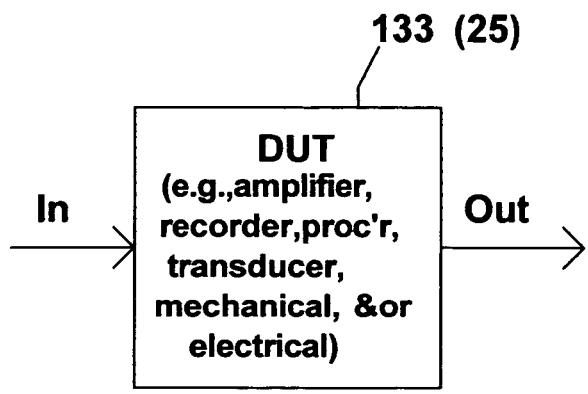
FIG. 18C shows one or more examples of the DUT.

A DUT or device under test may include an amplifier (stage), processor, recorder, transducer (e.g., microphone and or speaker, earphone, or the like), a mechanical device, an electromechanical device, an optical device, an electrical device, a magnetic device, and or an electromagnetic device. Any of these examples may be measured for an induced phase and or frequency modulation effect cause by one or more frequencies. FIG. 18C shows such examples of any DUT.

In an example of using an electromechanical device or transducer, a microphone may be tested for induced phase and or frequency modulation by sonically generating two or more sounds of different frequencies into the microphone and then outputting the microphone's signal to a detector and or modifier and detector for measuring phase and or frequency modulation effect(s). The multiple frequency sounds for example may be generated by musical instruments, and or loud speakers. In an example of using a loudspeaker or speaker system, signal(s) of multiple frequencies may be applied to a loudspeaker or loudspeaker system. The amplifier driving the loudspeaker would have to generate low amounts of induced phase and frequency modulation distortion itself. A method to avoid the need of a "perfect" amplifier is to use one amplifier for each (e.g., single) frequency signal and or to use a separate speaker for each amplifier. For example, for a two (or n) signal test, two (or n) amplifiers and two (or n) speakers are used. This way there is no induced phase or frequency modulation effect from the amplifiers or from the speakers since each item handles a single frequency. The multiple speakers then generate multiple sound signals to the microphone for testing in terms of a modulation effect (e.g., phase and or frequency).

So transducers such as loudspeakers, phonograph pickup cartridges, and or microphones (or other devices) may be tested for differential phase and or (differential) frequency modulation effect(s).

The invention is not limited to electrical devices. Mechanical devices may be tested similarly. Optical devices with different wavelength sources entering the optics may output a shift in wavelength caused by least one of the entering wavelength sources.

In the instance of magnetic or electromagnetic devices, examples would include waveguides and or antennas. For example, nonlinear effects of dielectrics may cause an induced phase and or frequency modulation effect. Some types of inductors and or transformers may be included as examples of magnetic and or electromagnetic devices.

In terms of an RF or radio frequency system, any of the embodiments are applicable. For example, in a broadband front end section of a receiver (e.g., broadcast or shortwave or higher frequency such as VHF or UHF) a lower frequency signal may induce a phase and or frequency modulation effect on receiving a higher frequency signal (or vice versa where by a higher frequency (RF) signal may induce a phase and or frequency modulation effect on a (received) lower frequency (RF) signal.) For example in AM broadcast, which has a range of 535 KHz to 1605 KHz, a large amplitude signal at 540 KHz can affect a received signal of 1600 KHz if the front end is broadband and uses a solid state device. Under a large signal condition, the solid state device has a varactor effect, which changes capacitance or reactance versus a voltage swing. The lower frequency signal at 540 KHz causes a modulation effect on the reception of the higher frequency 1600 KHz in terms of adding extra phase noise.

Any of the embodiments of the invention is applicable to electromechanical systems as well. For example, recorders or players can be tested for induced phase and or frequency modulation distortions caused by multiple input signals. Some players and or recorders may or may not include a mechanical apparatus, but can still be tested by any of the inventive methods mentioned.

A DUT may include audio compression systems, whether for audio processing and or for reduced data rate.

It should be noted that a time (or frequency) scaled version (e.g., time compressed and or expanded) of video test signals such as multiburst, modulated ramp or stairstep, multipulse, and or modulated sine squared pulse, is useful in testing various aspects of audio and RF devices (or a DUT). (Note that a varying biasing voltage or current may be used with any of these time scaled video signal provide new methods of testing.) As an alternative, it is possible to provide a video like signal (such as those video signals previously mentioned) into a DUT's input and then sample and store the output signal of the DUT. With the stored signal in memory, one would then clock the memory out at a rate such that a video test equipment (e.g., vectorscope or Tektronix VM700) will be able to measure differential gain and or phase, and or other video performance tests such as luma/chroma delay, K factor, and the like.

In terms of any of the signals from the output of a DUT, any of these signals may be processed. For example, any signal from the output of a DUT may be frequency mixed, modulated, shifted, and or translated to another frequency for measurement. Any signal frequency from the output of a DUT may be divided and or multiplied for a measurement (e.g., for a modulation effect).

One embodiment of the invention may be summarized as: A method of measuring frequency or phase modulation effects of an electronic, electromechanical, optical, mechanical, electromagnetic, magnetic, optical, and or transducer device, wherein the device has an input and an output, comprising:

coupling two or more frequency signals into the input; and providing an FM detector and or a phase detector coupled to the output of the device, to measure a frequency or phase modulation effect or frequency or phase shift for one or more frequency signals at the output of the device. It should be noted that the device's output may be coupled to a modifier's input, and the modifier's output may be coupled to a detector.

It should be noted that any or all of the previously mentioned methods, embodiments, and or apparatuses may be implemented in any combination of analog, digital, and or software.

For example, the complex or composite signal(s), modifier, and or detector may be generated in the analog domain, digital domain, and or in software.

As a further note, any or all the embodiments may be used for measuring a phase and or a frequency modulation effect of devices, which may include video devices. So the scope of the invention, may include audio, video, RF equipment, circuits, and or devices. On other note, the signal or signals coupled to the input of the device or DUT may include a source impedance. This source impedance may include any combination of resistive, capacitive, and or inductive element(s). For example, the signal coupled to an RF amplifier may be of moderate impedance such as 300 ohms. And in an audio amplifier, such as a phono cartridge preamplifier, the signal may be coupled to the phono preamplifier via a 500 millihenry inductor, a 500 pico farad capacitor, and a 47 thousand ohm load resistor, which may represent a high impedance signal source. Because RF and audio amplifiers may have input amplifier stages with nonlinear capacitance (or nonlinear inductance), including (a) source impedance for the signal source(s) may be necessary to reveal phase and or frequency modulation effect(s), such as those mentioned in any of the embodiments. It should be noted that the output of any DUT may be loaded. For example, a DUT's output may be loaded with a resistive, capacitive, inductive, and or electromechanical device (e.g., headphone or loudspeaker system). An output load for the DUT may reveal phase and or frequency modulation effect(s).

This disclosure is illustrative and not limiting; further modifications will be apparent to one skilled in the art and are intended to fall within the scope of the appended claims and or of the embodiments described.

That which is claimed is:

1. Method of measuring a frequency modulation effect of an electronic, electromechanical, optical, mechanical, electromagnetic, magnetic, and or transducer device, wherein the device has an input and an output, comprising:
coupling two or more signals of different frequencies into the input; and
providing an FM detector coupled to the output of the device, to measure a frequency modulation effect or frequency shift for one or more of the signals at the output of the device wherein the frequency modulation effect or frequency shift on one of the input signals is caused or induced by one or more of the other input signals.

2. Method of measuring one or more Wow and Flutter effects on an electronic device which includes an input and an output, wherein the one or more wow and flutter effects are caused or induced by an input signal; comprising:
applying two or more signals of multiple frequencies to the input of the device;
coupling the output of the device to an input of a modifier circuit, wherein the modifier circuit attenuates one or more signals at the output of the device; and
coupling a Wow and Flutter meter to an output of the modifier circuit, to measure the one or more Wow and Flutter effects of one frequency caused or induced by the input signal of another frequency.

3. The method of claim 2 wherein the modifier circuit reduces an amplitude of or removes one or more signal of at least one selected frequency from the output of the device.

4. Method of measuring induced phase or frequency modulation in a signal of multiple frequencies, or in signals of different frequencies, comprising:
applying the signal or signals to an input of a device; and
measuring induced phase modulation via a phase detector and or measuring induced frequency modulation via a frequency modulation detector at an output of the device, wherein a phase modulation effect on a lower frequency signal is induced or caused by a higher frequency signal and or measuring a frequency modulation effect on any selected signal frequency at the output of the device wherein the frequency modulation effect is caused or induced by the signal or signals of another selected frequency applied to the input of the device.

5. The method of claim 4 wherein the selected frequency from the output of the device may include any fundamental, harmonic, and or intermodulation frequency component.

6. The method of claim 5 wherein an amplitude detector measures amplitude variations of any of the phase and or frequency modulated signal frequencies.

7. The method of claim 4 wherein the derivative of the phase detector is taken to provide a frequency modulation measurement, and or wherein an integrated function of the frequency modulation detector provides a phase modulation measurement.

8. The method of claim 4 wherein one of the signals is a dynamic biasing signal, wherein the dynamic biasing signal provides a dynamic offset output voltage or current.

9. Method of providing an audio and or radio frequency test signal, comprising:
adding and or inserting a lower frequency ramp or stepped signal to measure an induced phase or frequency modulation effect, and one or more signals of higher frequencies for measuring the induced phase or frequency modulation effect on the one or more signals of higher frequencies caused by the lower frequency ramp or stepped signal, to provide the audio and or radio frequency test signal wherein the audio or radio frequency test signal is coupled to an input of an audio or radio frequency device and wherein the output of the audio or radio frequency device is measured for the phase or frequency modulation effect on the one or more signals of higher frequencies caused by the lower frequency ramp or stepped signal.

10. The method of claim 9 wherein a unipolar or bipolar synchronizing signal is added or inserted, and wherein the audio and or radio frequency test signal is coupled to a device for testing a dynamic phase or frequency modulation effect.

11. Method of measuring frequency modulation effects of a device under test, wherein a test signal is coupled to an input to the device and wherein the test signal includes a lower frequency signal combined with a higher frequency signal, comprising:
coupling a frequency to voltage converter or FM detector to an output of the device; and
measuring the higher frequency signal at the output of the device for at least one frequency modulation effect which is caused or induced by the lower frequency signal at the input, or measuring the lower frequency signal at the output of the device for at least one frequency modulation effect which is caused or induced by the higher frequency signal at the input.

12. The method of claim 11 wherein the test signal includes a synchronizing signal.

13. The method of claim 11 wherein the higher frequency signal comprises an amplitude modulated signal, frequency modulated signal, and or two or more higher frequency signals.

14. Method of measuring a phase and or frequency modulation. effect of one or more distortion signal from an output of a device, wherein an input of the device is coupled to at least one signal of two or more frequencies or to two or more signals of two or more frequencies, comprising:
filtering at the output of the device to provide a selected frequency to a phase detector and or a frequency modulation detector for measuring the phase and or frequency modulation effect of one or more distortion signal at the output of the device, wherein the one or more distortion signal comprises harmonic and or intermodulation distortion and wherein the phase or frequency modulation effect on the one or more distortion signal at the output of the device is caused by the one or more signals coupled to the input of the device.

15. Method of measuring at least one induced phase modulation and or frequency modulation effect of an audio or radio frequency device that has an input and an output, comprising:

supplying one or more signals including two or more frequencies to the input of the audio or radio frequency device; and coupling a phase detector, FM detector, and or frequency to voltage converter to the output of the audio or radio frequency device to measure the frequency modulation of any signal from the output of the audio or radio frequency device, or the phase modulation of a lower frequency signal of the output that is induced by a higher frequency signal from an audio device, wherein the induced phase or frequency modulation effect on the input signal of one frequency is caused by the one or more input signals of another frequency.

16. The method of claim 15 wherein at least one signal coupled to the input of the audio or radio frequency device is a modulated signal source.

17. The method of claim 15 wherein a modifier or filter is disposed between the output of the audio or radio frequency device and the input of the phase detector, FM detector, and or frequency to voltage converter.

18. The method of claim 17 wherein the modifier removes or reduces in amplitude one or more signals from the output of the audio or radio frequency device.

19. The method of claim 18 wherein a Wow and Flutter meter is coupled to the modifier.

20. The method of claim 15 wherein the higher frequency signal comprises an amplitude modulated signal, frequency modulated signal, and or two or more higher frequency signals.

\* \* \* \* \*